United States Patent
Bita et al.

(10) Patent No.: US 8,379,392 B2
(45) Date of Patent: Feb. 19, 2013

(54) LIGHT-BASED SEALING AND DEVICE PACKAGING

(75) Inventors: Ion Bita, San Jose, CA (US); John H. Hong, San Clemente, CA (US); Khurshid S. Alam, Mountain View, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 483 days.

(21) Appl. No.: 12/605,246

(22) Filed: Oct. 23, 2009

(65) Prior Publication Data

US 2011/0096508 A1    Apr. 28, 2011

(51) Int. Cl.
*H05K 7/00* (2006.01)
*H05K 1/03* (2006.01)
*H05K 1/14* (2006.01)
*H05K 7/02* (2006.01)

(52) U.S. Cl. ........ 361/735; 174/255; 174/256; 361/728; 361/804; 361/807; 361/809; 361/810

(58) Field of Classification Search .................. 174/520, 174/255, 256; 345/204; 359/290, 291; 361/728, 361/735, 804, 807, 809, 810
See application file for complete search history.

(56) References Cited

U.S. PATENT DOCUMENTS

| | | | |
|---|---|---|---|
| 3,704,806 A | 12/1972 | Plachenov et al. | |
| 3,900,440 A | 8/1975 | Ohara et al. | |
| 4,036,360 A | 7/1977 | Deffeyes | |
| 4,074,480 A | 2/1978 | Burton | |
| 4,310,220 A | 1/1982 | Kuwagaki et al. | |
| 4,383,255 A | 5/1983 | Grandjean et al. | |
| 4,431,691 A | 2/1984 | Greenlee | |
| 4,459,182 A | 7/1984 | te Velde | |
| 4,531,126 A | 7/1985 | Sadones | |
| 4,547,876 A * | 10/1985 | Ettenberg | 369/275.3 |

(Continued)

FOREIGN PATENT DOCUMENTS

| | | |
|---|---|---|
| CN | 1449990 | 10/2003 |
| EP | 0 695 959 | 2/1996 |

(Continued)

OTHER PUBLICATIONS

ISR and WO dated May 31, 2011 in PCT/US10/053445.

(Continued)

*Primary Examiner* — Timothy Thompson
*Assistant Examiner* — Sherman Ng
(74) *Attorney, Agent, or Firm* — Knobbe Martens Olson & Bear LLP

(57) ABSTRACT

Systems and methods for manufacturing and packaging electronic devices with light absorptive thin film stacks are provided. In one embodiment, a light is applied to a light absorptive thin film stack disposed between a substrate and a backplate to seal the substrate to the backplate. In another embodiment, the light absorptive thin film stack includes a plurality of thin film layers. In yet another embodiment, the light absorptive thin film stack includes a spacer layer over a reflective layer and an absorber layer over the spacer layer. In still another embodiment, the light absorptive thin film stack is less than 200 nanometers thick. In yet a further embodiment, a light absorptive thin film stack is used to seal a substrate having glass, plastic, metal, or silicon to a backplate having glass, plastic, metal, or silicon. Thus, the light absorptive thin film stack is used to seal similar or dissimilar materials through a bonding process.

23 Claims, 11 Drawing Sheets

U.S. PATENT DOCUMENTS

| | | | |
|---|---|---|---|
| 4,552,806 A | 11/1985 | Hayashi et al. | |
| 4,950,344 A | 8/1990 | Glover et al. | |
| 4,954,789 A | 9/1990 | Sampsell | |
| 4,956,619 A | 9/1990 | Hornbeck | |
| 4,977,009 A | 12/1990 | Anderson et al. | |
| 5,018,256 A | 5/1991 | Hornbeck | |
| 5,075,796 A | 12/1991 | Schildkraut et al. | |
| 5,091,983 A | 2/1992 | Lukosz | |
| 5,095,375 A | 3/1992 | Bolt | |
| 5,099,353 A | 3/1992 | Hornbeck | |
| 5,171,606 A * | 12/1992 | Mayer et al. | 427/162 |
| 5,172,262 A | 12/1992 | Hornbeck | |
| 5,212,582 A | 5/1993 | Nelson | |
| 5,216,537 A | 6/1993 | Hornbeck | |
| 5,244,707 A | 9/1993 | Shores | |
| 5,268,533 A | 12/1993 | Kovacs et al. | |
| 5,293,511 A | 3/1994 | Poradish et al. | |
| 5,304,419 A | 4/1994 | Shores | |
| 5,322,161 A | 6/1994 | Shichman et al. | |
| 5,331,454 A | 7/1994 | Hornbeck | |
| 5,381,253 A | 1/1995 | Sharp et al. | |
| 5,401,983 A | 3/1995 | Jokerst et al. | |
| 5,547,823 A | 8/1996 | Murasawa et al. | |
| 5,550,373 A | 8/1996 | Cole et al. | |
| 5,553,440 A | 9/1996 | Bulger et al. | |
| 5,559,358 A | 9/1996 | Burns et al. | |
| 5,591,379 A | 1/1997 | Shores | |
| 5,646,729 A | 7/1997 | Koskinen et al. | |
| 5,683,591 A | 11/1997 | Offenberg | |
| 5,703,710 A | 12/1997 | Brinkman et al. | |
| 5,717,476 A | 2/1998 | Kanezawa | |
| 5,739,945 A | 4/1998 | Tayebati | |
| 5,771,321 A | 6/1998 | Stern | |
| 5,784,166 A | 7/1998 | Sogard | |
| 5,784,189 A | 7/1998 | Bozler et al. | |
| 5,815,141 A | 9/1998 | Phares | |
| 5,835,255 A | 11/1998 | Miles | |
| 5,837,562 A | 11/1998 | Cho | |
| 5,853,662 A | 12/1998 | Watanabe | |
| 5,856,820 A | 1/1999 | Weigers et al. | |
| 5,936,758 A | 8/1999 | Fisher et al. | |
| 5,939,785 A | 8/1999 | Klonis et al. | |
| 5,959,763 A | 9/1999 | Bozler et al. | |
| 5,986,796 A | 11/1999 | Miles | |
| 5,999,306 A | 12/1999 | Atobe et al. | |
| 6,040,937 A | 3/2000 | Miles | |
| 6,055,090 A | 4/2000 | Miles | |
| 6,107,115 A | 8/2000 | Atobe et al. | |
| 6,120,339 A | 9/2000 | Alwan | |
| 6,127,765 A | 10/2000 | Fushinobu | |
| 6,195,196 B1 | 2/2001 | Kimura et al. | |
| 6,238,755 B1 | 5/2001 | Harvey et al. | |
| 6,284,342 B1 | 9/2001 | Ebisawa et al. | |
| 6,303,986 B1 | 10/2001 | Shook | |
| 6,355,328 B1 | 3/2002 | Baratuci et al. | |
| 6,365,229 B1 | 4/2002 | Robbins | |
| 6,379,988 B1 | 4/2002 | Peterson et al. | |
| 6,426,124 B2 | 7/2002 | Olster et al. | |
| 6,426,461 B1 | 7/2002 | Ginter et al. | |
| 6,447,126 B1 | 9/2002 | Hornbeck | |
| 6,455,927 B1 | 9/2002 | Glenn et al. | |
| 6,462,392 B1 | 10/2002 | Pinter et al. | |
| 6,465,355 B1 | 10/2002 | Horsley | |
| 6,466,354 B1 | 10/2002 | Gudeman | |
| 6,467,139 B1 | 10/2002 | Tanaka | |
| 6,472,739 B1 | 10/2002 | Wood et al. | |
| 6,489,670 B1 | 12/2002 | Peterson et al. | |
| 6,495,895 B1 | 12/2002 | Peterson et al. | |
| 6,507,385 B1 | 1/2003 | Nishiyama et al. | |
| 6,525,416 B2 | 2/2003 | Hauser et al. | |
| 6,538,312 B1 | 3/2003 | Peterson et al. | |
| 6,558,820 B2 | 5/2003 | Raychaudhuri et al. | |
| 6,582,789 B1 | 6/2003 | Sumi | |
| 6,583,921 B2 | 6/2003 | Nelson | |
| 6,589,625 B1 | 7/2003 | Kothari et al. | |
| 6,603,182 B1 | 8/2003 | Low et al. | |
| 6,621,134 B1 | 9/2003 | Zurn | |
| 6,627,814 B1 | 9/2003 | Stark | |
| 6,646,709 B2 | 11/2003 | Matsumoto | |
| 6,650,455 B2 | 11/2003 | Miles | |
| 6,661,084 B1 | 12/2003 | Peterson et al. | |
| 6,674,159 B1 | 1/2004 | Peterson et al. | |
| 6,674,562 B1 | 1/2004 | Miles et al. | |
| 6,680,792 B2 | 1/2004 | Miles | |
| 6,690,444 B1 | 2/2004 | Wilkinson et al. | |
| 6,709,750 B1 | 3/2004 | Pohlmann et al. | |
| 6,743,656 B2 | 6/2004 | Orcutt et al. | |
| 6,778,046 B2 | 8/2004 | Stafford et al. | |
| 6,779,260 B1 | 8/2004 | Brandenburg et al. | |
| 6,791,660 B1 | 9/2004 | Hayashi et al. | |
| 6,833,668 B1 | 12/2004 | Yamada et al. | |
| 6,838,309 B1 | 1/2005 | McCann | |
| 6,843,936 B1 | 1/2005 | Jacobs | |
| 6,867,896 B2 | 3/2005 | Miles | |
| 6,872,984 B1 | 3/2005 | Leung | |
| 6,882,458 B2 | 4/2005 | Lin et al. | |
| 6,882,480 B2 | 4/2005 | Yanagisawa | |
| 6,914,245 B2 | 7/2005 | Sone et al. | |
| 6,940,631 B2 | 9/2005 | Ishikawa | |
| 6,947,200 B2 | 9/2005 | Huibers | |
| 6,977,391 B2 | 12/2005 | Frischknecht | |
| 6,995,890 B2 | 2/2006 | Lin | |
| 6,999,225 B2 | 2/2006 | Lin et al. | |
| 7,012,726 B1 | 3/2006 | Miles | |
| 7,012,732 B2 | 3/2006 | Miles | |
| 7,015,885 B2 | 3/2006 | Novotny et al. | |
| 7,019,458 B2 | 3/2006 | Yoneda | |
| 7,034,984 B2 | 4/2006 | Pan et al. | |
| 7,042,643 B2 | 5/2006 | Miles | |
| 7,046,374 B1 | 5/2006 | Barbarossa | |
| 7,060,895 B2 | 6/2006 | Kothari et al. | |
| 7,119,945 B2 | 10/2006 | Kothari et al. | |
| 7,122,937 B2 | 10/2006 | Hatakeyama et al. | |
| 7,123,216 B1 | 10/2006 | Miles | |
| 7,126,741 B2 | 10/2006 | Wagner et al. | |
| 7,130,104 B2 | 10/2006 | Cummings | |
| 7,136,213 B2 | 11/2006 | Chui | |
| 7,138,984 B1 | 11/2006 | Miles | |
| 7,142,346 B2 | 11/2006 | Chui et al. | |
| 7,153,016 B2 | 12/2006 | Chen | |
| 7,161,728 B2 | 1/2007 | Sampsell et al. | |
| 7,164,520 B2 | 1/2007 | Palmateer et al. | |
| 7,184,202 B2 | 2/2007 | Miles et al. | |
| 7,218,438 B2 | 5/2007 | Przybyla et al. | |
| 7,259,449 B2 | 8/2007 | Floyd | |
| 7,282,393 B2 | 10/2007 | Tarn | |
| 7,307,776 B2 | 12/2007 | Miles et al. | |
| 7,317,281 B2 | 1/2008 | Hayashi et al. | |
| 7,327,510 B2 | 2/2008 | Cummings et al. | |
| 7,368,803 B2 | 5/2008 | Gally et al. | |
| 7,381,583 B1 | 6/2008 | Ebel et al. | |
| 7,385,748 B2 | 6/2008 | Miles | |
| RE40,436 E | 7/2008 | Kothari et al. | |
| 7,393,712 B2 | 7/2008 | Smith et al. | |
| 7,405,924 B2 | 7/2008 | Gally et al. | |
| 7,424,198 B2 * | 9/2008 | Palmateer et al. | 385/147 |
| 7,433,555 B2 | 10/2008 | Lee et al. | |
| 7,443,563 B2 | 10/2008 | Palmateer et al. | |
| 7,446,926 B2 | 11/2008 | Sampsell | |
| 7,456,497 B2 | 11/2008 | Higashi | |
| 7,470,373 B2 | 12/2008 | Tsai | |
| 7,471,444 B2 | 12/2008 | Miles | |
| 7,517,712 B2 | 4/2009 | Stark | |
| 7,518,775 B2 | 4/2009 | Miles et al. | |
| 7,532,385 B2 | 5/2009 | Lin | |
| 7,551,246 B2 | 6/2009 | Palmateer | |
| 7,561,334 B2 | 7/2009 | Luo | |
| 7,573,547 B2 | 8/2009 | Palmateer et al. | |
| 7,629,678 B2 | 12/2009 | Floyd | |
| 7,642,127 B2 | 1/2010 | Floyd | |
| 7,746,537 B2 | 6/2010 | Natarajan | |
| 7,816,164 B2 | 10/2010 | Kothari et al. | |
| 2001/0004085 A1 | 6/2001 | Gueissaz | |
| 2001/0055146 A1 | 12/2001 | Atobe et al. | |
| 2002/0000649 A1 | 1/2002 | Tilmans et al. | |
| 2002/0012364 A1 | 1/2002 | Kalian et al. | |
| 2002/0043706 A1 | 4/2002 | Jerominek et al. | |

| | | |
|---|---|---|
| 2002/0052392 A1 | 5/2002 | Day et al. |
| 2002/0056898 A1 | 5/2002 | Lopes et al. |
| 2002/0056900 A1 | 5/2002 | Liu et al. |
| 2002/0057565 A1 | 5/2002 | Seo |
| 2002/0075551 A1 | 6/2002 | Daneman |
| 2002/0075555 A1 | 6/2002 | Miles |
| 2002/0121909 A1 | 9/2002 | Sato et al. |
| 2002/0146200 A1 | 10/2002 | Kudrle et al. |
| 2002/0160583 A1 | 10/2002 | Song |
| 2002/0187254 A1 | 12/2002 | Ghosh |
| 2003/0043157 A1 | 3/2003 | Miles |
| 2003/0053233 A1 | 3/2003 | Felton |
| 2003/0054588 A1 | 3/2003 | Patel et al. |
| 2003/0062186 A1 | 4/2003 | Boroson et al. |
| 2003/0072070 A1 | 4/2003 | Miles |
| 2003/0075794 A1 | 4/2003 | Felton et al. |
| 2003/0103185 A1 | 6/2003 | Kim et al. |
| 2003/0104651 A1 | 6/2003 | Kim et al. |
| 2003/0108306 A1 | 6/2003 | Whitney et al. |
| 2003/0143423 A1 | 7/2003 | McCormick et al. |
| 2003/0144034 A1 | 7/2003 | Hack et al. |
| 2003/0152787 A1 | 8/2003 | Arakawa et al. |
| 2003/0152872 A1 | 8/2003 | Miles |
| 2003/0155643 A1 | 8/2003 | Freidhoff |
| 2003/0161126 A1 | 8/2003 | Wilkinson et al. |
| 2003/0183916 A1 | 10/2003 | Heck et al. |
| 2003/0184412 A1 | 10/2003 | Gorrell |
| 2003/0214007 A1 | 11/2003 | Tao et al. |
| 2004/0048037 A1 | 3/2004 | Klausmann et al. |
| 2004/0051929 A1 | 3/2004 | Sampsell et al. |
| 2004/0061492 A1 | 4/2004 | Lopes et al. |
| 2004/0066258 A1 | 4/2004 | Cohn et al. |
| 2004/0070706 A1 | 4/2004 | Freeman |
| 2004/0076008 A1 | 4/2004 | Ikeda |
| 2004/0080382 A1 | 4/2004 | Nakanishi et al. |
| 2004/0100677 A1 | 5/2004 | Huibers et al. |
| 2004/0126953 A1 | 7/2004 | Cheung |
| 2004/0140557 A1 | 7/2004 | Sun et al. |
| 2004/0150319 A1 | 8/2004 | Tomimatsu et al. |
| 2004/0163472 A1 | 8/2004 | Nagahara |
| 2004/0166606 A1 | 8/2004 | Forehand |
| 2004/0173886 A1 | 9/2004 | Carley |
| 2004/0183990 A1 | 9/2004 | Guang et al. |
| 2004/0184133 A1 | 9/2004 | Su et al. |
| 2004/0218251 A1 | 11/2004 | Piehl et al. |
| 2004/0232535 A1 | 11/2004 | Tarn |
| 2005/0001545 A1 | 1/2005 | Aitken et al. |
| 2005/0002079 A1 | 1/2005 | Novotny et al. |
| 2005/0023976 A1 | 2/2005 | Wang |
| 2005/0036095 A1 | 2/2005 | Yeh et al. |
| 2005/0036192 A1 | 2/2005 | Lin et al. |
| 2005/0046919 A1 | 3/2005 | Taguchi et al. |
| 2005/0046922 A1 | 3/2005 | Lin et al. |
| 2005/0074919 A1 | 4/2005 | Patel et al. |
| 2005/0093134 A1 | 5/2005 | Tarn |
| 2005/0116924 A1 | 6/2005 | Sauvante et al. |
| 2005/0159028 A1 | 7/2005 | Sweetland et al. |
| 2005/0167795 A1 | 8/2005 | Higashi |
| 2005/0174048 A1 | 8/2005 | Matsukaze |
| 2005/0184304 A1 | 8/2005 | Gupta et al. |
| 2005/0195462 A1 | 9/2005 | Lin |
| 2005/0200835 A1 | 9/2005 | Moy et al. |
| 2005/0253283 A1 | 11/2005 | DCamp et al. |
| 2005/0254982 A1 | 11/2005 | Cadeddu |
| 2005/0258516 A1 | 11/2005 | Hong et al. |
| 2005/0275079 A1 | 12/2005 | Stark |
| 2006/0023327 A1* | 2/2006 | Coombs et al. ............... 359/883 |
| 2006/0029732 A1 | 2/2006 | Kobrin et al. |
| 2006/0066600 A1 | 3/2006 | Palmateer |
| 2006/0066601 A1* | 3/2006 | Kothari et al. ................ 345/204 |
| 2006/0066783 A1* | 3/2006 | Sampsell ...................... 349/114 |
| 2006/0067642 A1 | 3/2006 | Tyger |
| 2006/0076631 A1 | 4/2006 | Palmateer et al. |
| 2006/0076632 A1 | 4/2006 | Palmateer et al. |
| 2006/0076634 A1 | 4/2006 | Palmateer et al. |
| 2006/0076637 A1 | 4/2006 | Gally |
| 2006/0077126 A1 | 4/2006 | Kothari |
| 2006/0077145 A1 | 4/2006 | Floyd |
| 2006/0077503 A1 | 4/2006 | Palmateer et al. |
| 2006/0077524 A1 | 4/2006 | Palmateer |
| 2006/0082298 A1 | 4/2006 | Becken et al. |
| 2006/0152106 A1 | 7/2006 | Yan et al. |
| 2006/0197215 A1 | 9/2006 | Potter |
| 2006/0214247 A1 | 9/2006 | Dcamp et al. |
| 2006/0214569 A1 | 9/2006 | Ohshita et al. |
| 2006/0274400 A1 | 12/2006 | Miles |
| 2007/0008607 A1* | 1/2007 | Miles ............................ 359/291 |
| 2007/0064295 A1 | 3/2007 | Faase et al. |
| 2007/0242345 A1 | 10/2007 | Natarajan et al. |
| 2007/0297037 A1 | 12/2007 | Chui et al. |
| 2008/0018783 A1 | 1/2008 | Wang et al. |
| 2008/0037104 A1 | 2/2008 | Hagood et al. |
| 2008/0112036 A1 | 5/2008 | Cummings |
| 2008/0137025 A1 | 6/2008 | Ueda |
| 2008/0151347 A1* | 6/2008 | Chui et al. ..................... 359/238 |
| 2008/0217709 A1 | 9/2008 | Minervini et al. |
| 2009/0059342 A1 | 3/2009 | Palmateer et al. |
| 2009/0103167 A1 | 4/2009 | Tsai |
| 2009/0189230 A1 | 7/2009 | Palmateer et al. |
| 2009/0219605 A1 | 9/2009 | Lin et al. |
| 2009/0257109 A1 | 10/2009 | Miles et al. |
| 2009/0261244 A1 | 10/2009 | Syms |
| 2009/0321867 A1 | 12/2009 | Leib et al. |
| 2009/0323170 A1 | 12/2009 | Lin |
| 2010/0020382 A1 | 1/2010 | Su et al. |
| 2010/0055841 A1 | 3/2010 | Ozawa |
| 2010/0072595 A1 | 3/2010 | Floyd |
| 2010/0144230 A1 | 6/2010 | Tyger |
| 2010/0172013 A1 | 7/2010 | Palmateer |
| 2011/0059275 A1 | 3/2011 | Stark |
| 2011/0092018 A1 | 4/2011 | LaFond et al. |
| 2011/0097845 A1 | 4/2011 | Ables et al. |

FOREIGN PATENT DOCUMENTS

| | | |
|---|---|---|
| EP | 0 822 570 | 2/1998 |
| EP | 1 093 162 | 4/2001 |
| EP | 1 418 154 | 5/2004 |
| EP | 1 433 742 | 6/2004 |
| EP | 1 457 804 | 9/2004 |
| FR | 2841380 | 12/2003 |
| JP | 59-6842 | 1/1984 |
| JP | 61-206244 | 9/1986 |
| JP | 63-162378 | 10/1988 |
| JP | 04-085859 | 3/1992 |
| JP | 10-70287 | 3/1998 |
| JP | 08-162006 | 6/1998 |
| JP | 11-145337 | 5/1999 |
| JP | 11 337953 | 12/1999 |
| JP | 2000-156287 | 6/2000 |
| JP | 2001-305514 | 10/2001 |
| JP | 2001-318324 | 11/2001 |
| JP | 2001-351998 | 12/2001 |
| JP | 2002-062491 | 2/2002 |
| JP | 2002-062492 | 2/2002 |
| JP | 2002-258310 | 9/2002 |
| JP | 2002-296519 | 10/2002 |
| JP | 2002-312066 | 10/2002 |
| JP | 2002-328313 | 11/2002 |
| JP | 2002-357846 | 12/2002 |
| JP | 2003-57571 | 2/2003 |
| JP | 2003-075741 | 3/2003 |
| JP | 2003-233024 | 8/2003 |
| JP | 2003-315693 | 11/2003 |
| JP | 2003-330001 | 11/2003 |
| JP | 2004-053852 | 2/2004 |
| JP | 2004-78107 | 3/2004 |
| JP | 2004-118001 | 4/2004 |
| WO | WO 90/05795 | 5/1990 |
| WO | WO 94/28452 | 12/1994 |
| WO | WO 95/01624 | 1/1995 |
| WO | WO 98/06118 | 2/1998 |
| WO | WO 00/16105 | 3/2000 |
| WO | WO 00/17695 | 3/2000 |
| WO | WO 01/45140 | 6/2001 |
| WO | WO 01/58804 | 8/2001 |
| WO | WO 02/42716 | 5/2002 |
| WO | WO 03/009318 | 1/2003 |
| WO | WO 03/023849 | 3/2003 |

| WO | WO 03/026369 | 3/2003 |
| WO | WO 03/054925 | 3/2003 |
| WO | WO 03/070625 | 8/2003 |
| WO | WO 03/084861 | 10/2003 |
| WO | WO 03/095706 | 11/2003 |
| WO | WO 03/105198 | 12/2003 |
| WO | WO 2004/025727 | 3/2004 |
| WO | WO 2004/077523 | 9/2004 |
| WO | WO 2005/113376 | 12/2005 |

OTHER PUBLICATIONS

He et al., Jan. 30-Feb. 3, 2005, On-chip hermetic packaging enabled by post-deposition electrochemical etching of polysilicon, 18th IEEE Conf. on MEMS Proceedings, pp. 544-547.

IPRP dated May 3, 2012 in PCT/US10/053445.

Greco et al., Optical properties of IPN-like networks polyethylene/poly(butylmethacrylate-co-styrene copolymer systems, III. Influence of copolymer crosslinkers, Polymer 42 (2001), 5089-5095.

Jung et al., Soldered sealing process to assemble a protective cap for a MEMS CSP, Design, Test, Integration and Packaging of MEMS/MOEMS 2003 Symposium, pp. 255-260.

Kim et al., Fabrication and characteriziation of a low-temperature hermetic MEMS package bonded by a closed loop AuSn solder-line, Proceedings of the IEEE 16th Annual International Conference on Micro Electro Mechanical Systems, Jan. 2003, pp. 614-617.

Liang, Zhi-Hao et al., "A Low Temperature Wafer-Level Hermetic MEMS Package Using UV Curable Adhesive", Electronic Components and Technology Conference, 2004 IEEE, pp. 1486-1491.

Maharbiz et al., Batch micropackaging by compression-bonded wafer-wafer transfer, Twelfth IEEE International Conference on Micro Electro Mechanical Systems, Jan. 17-21, 1999, pp. 482-489.

Miles, MEMS-based interferometric modulator for display applications, Proceedings of the SPIE, Micromachined Devices and Components V, Sep. 1999, pp. 20-28.

Moraja, et al., Advanced Getter Solutions at Wafer Level to Assure High Reliability to the last Generations MEMS, IEEE Reliability Physics Symposium Proceedings, 2003, pp. 458-459.

Sparks, et al. Chip-Level Vacuum Packaging of Micromachines Using NanoGetters, IEEE Transactions on Advanced Packaging, vol. 26 Issue 3, Aug. 2003, pp. 277-282.

Stark et al., An integrated process for post-packaging release and vacuum sealing of electroplated nickel packages, Transducers, 12th International Conference on Solid-State Sensors, Actuators and Microsystems, 2003, pp. 1911-1914.

Tao et al., Selective Bonding and encapsulation for wafer-level vacuum packaging of mems and related micro systems, Microelectronics and Reliability, 44(2):251-258, Feb. 2004.

Tilmans et al., The indent reflow sealing (IRS) technique—A method for the fabrication of scaled cavities for mems devices, Journal of Microelectromechanical Systems, 9(2), Jun. 2000.

Tominetti, et al., Moisture and impurities detection and removal in packaged MEMS, Proceedings of the SPIE, Reliability, Testing and Characterization of MEMS/MOEMS, Oct. 2001, pp. 215-225.

Yang et al., Localized induction heating solder bonding for wafer level MEMS packaging, 17th IEEE International Conference on Micro Electro Mechanical Systems, Jan. 2004, pp. 729-732.

* cited by examiner

LIGHT-BASED SEALING AND DEVICE PACKAGING

BACKGROUND

1. Field of the Invention

The field of the invention relates to microelectromechanical systems (MEMS) and organic light-emitting diode (OLED) devices, and more particularly, to methods and systems for packaging MEMS and OLED devices.

2. Description of Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. Interferometric modulators may have a pair of conductive plates, one or both of which may be transparent and/or reflective in whole or part and capable of relative motion upon application of an appropriate electrical signal. In some interferometric modulators, one plate has a stationary layer deposited on a substrate and the other plate has a metallic membrane separated from the stationary layer by an air gap. The position of one plate in relation to another changes the optical interference of light incident on the interferometric modulator.

Cost effective packaging solutions that satisfy a variety of performance requirements are desired. Such requirements include resistance to moisture, minimized outgassing, and use of materials with similar coefficients of thermal expansion. One element in packaging technologies is the seal between materials used to create the package. The seal can provide mechanical integrity to the package, as well as a barrier to moisture and other contaminants. Seals are used in MEMS devices such as interferometric modulators, whose mechanical switching elements are susceptible to stiction caused by moisture or contaminants. Use of epoxies in sealing technologies can be limited by excessive outgassing, which can deposit harmful organic material on sensitive elements. Ceramic and metal packages can be welded or fusion bonded to yield hermeticity, but at relatively high cost. A less expensive method uses silica loaded epoxies to bond various packaging materials, but high hermeticity is generally not achieved.

Laser-based sealing has been used to seal materials in packaging applications. Typically, laser light is focused at the perimeter of a device, melting one or more materials at the perimeter and forming a bond. Some techniques deposit an interlayer between two materials to be bonded. The laser can be focused on and melt the interlayer to create a seal between the two materials. Graduated melting occurs, such that the melting takes place at the interface of two materials, or at an interlayer between the two materials, with the melt front growing gradually.

Unfortunately, in conventional laser-based sealing, a significant volume of material is typically heated to form the bond. In order to heat the material, the laser also heats the surrounding material to such a degree that it can affect neighboring components.

The effectiveness of laser-based bonding techniques is also limited by the optical absorbance of the materials present in the device. For example, lens systems are commonly used to focus laser light closer to the interface to be bonded, but the practical application of this technique is limited with transparent or optically homogenous substrates. Such substrates often absorb a substantial amount of the incident laser light before it reaches the interface. If insufficient laser light reaches the interface, there is insufficient heat generation and melting may not occur.

One bonding method creates a global bond using direct surface covalent bonding between pristine surfaces under high vacuum and temperature conditions, but at very high costs. Another bonding method uses anodic bonding aided by high electrostatic fields and elevated temperatures. Excessively harsh packaging conditions, including high temperature, make this method impractical for many device packaging applications, however.

Microwaves have also been used to heat metal layers placed at the interface of two materials to be bonded. Further, resistive heating with electrical currents flowing through metal traces have also been used to heat solders locally. These techniques suffer many of the same drawbacks noted above, however, including disadvantageous heating of a significant volume of material above and below the bond line. The resistive heating method is also impractical for MEMS applications because it requires high current density electrical interconnects through the wafer, complicating the fabrication process.

SUMMARY OF CERTAIN EMBODIMENTS

One embodiment is a method of manufacturing an electronic device. The method includes providing a substrate having an electronic device; providing a backplate configured to be sealed to the substrate, where a light absorptive thin film stack is disposed between the substrate and the backplate; and applying a light to the thin film stack to seal the substrate to the backplate. In some embodiments, the light is a laser light. In one embodiment, the thin film stack includes a plurality of layers. In another embodiment, the thin film stack includes an absorber layer over a reflective layer. In yet another embodiment, the thin film stack includes a spacer layer over a reflective layer, and an absorber layer over the spacer layer. In still a further embodiment, a liquid crystal polymer is disposed between the substrate and the backplate. In still another embodiment, the light is incident on the absorber layer. An electronic device formed by the method of manufacturing is also provided.

In some embodiments, at least one of the spacer layer, the reflective layer, and the absorber layer is less than about 10 nanometers thick. In other embodiments, a light of a specific wavelength is selected, and the thickness of the spacer layer is chosen to increase absorption of the selected wavelength of light. In another embodiment, the method includes joining the substrate and the backplate in a modified pressure atmosphere. In yet another embodiment, the light absorptive thin film stack comprises an interferometric modulator.

Another embodiment is an electronic device package. The package includes a substrate having an electronic device; a backplate; and a light-treated thin film seal disposed between the substrate and the backplate to form a package including the electronic device. In some embodiments, the light-treated thin film seal is a laser-light-treated thin film seal. In one embodiment, the thin film seal includes a reflective layer over a spacer layer and an absorber layer over the spacer layer. In another embodiment, the substrate includes glass, plastic, metal, or silicon. In yet another embodiment, the backplate includes glass, plastic, metal, or silicon. In still a further embodiment, the spacer layer includes a silicon dioxide, a metal oxide, a nitride, or a polymer. In still another embodiment, the absorber layer includes molybdenum, chromium, silver, or a molybdenum-chromium alloy. In yet a further embodiment, the reflective layer includes a metal. The electronic device can include a MEMS device, an organic light emitting diode (OLED) device, or an interferometric modulator display device.

Still another embodiment is an electronic display that includes means for supporting a display device; means for covering the display device to form a package; and means for forming a thin film seal between the covering means and the supporting means. In one embodiment, the forming means includes a light-treated thin film seal. In some embodiments, the light-treated thin film seal is a laser-light-treated thin film seal. In another embodiment, the supporting means includes a transparent substrate. In yet another embodiment, the covering means comprises a backplate. In still another embodiment, the fanning means includes a plurality of thin film layers. In still a further embodiment, the plurality of layers includes a spacer layer over a reflective layer and an absorber layer over the spacer layer.

DETAILED DESCRIPTION

Figure 1:
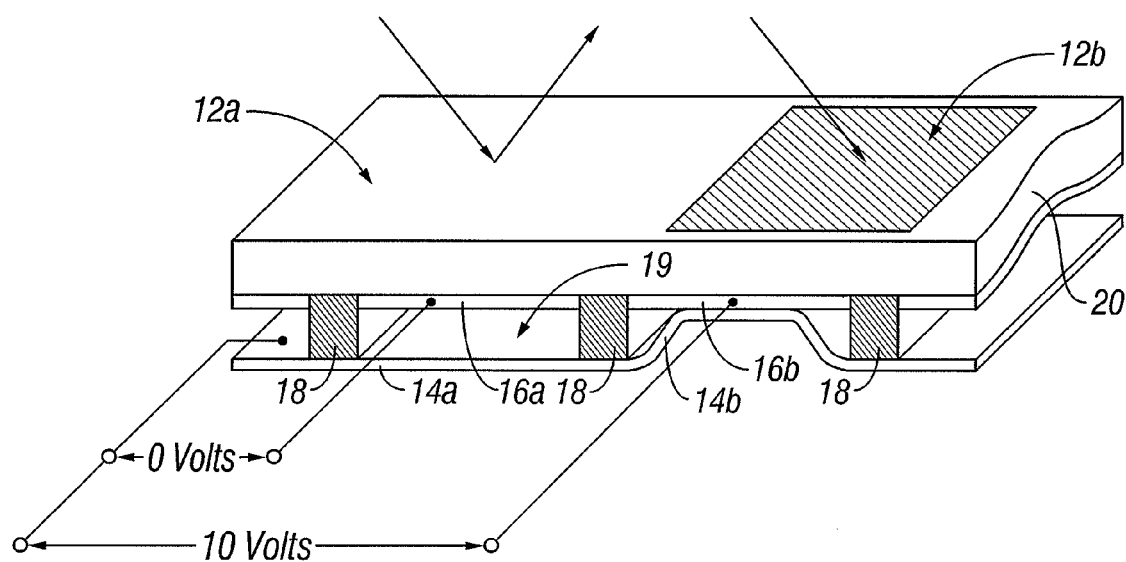
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

The following detailed description is directed to certain specific embodiments. However, the teachings herein can be applied in a multitude of different ways. In this description, reference is made to the drawings wherein like parts are designated with like numerals throughout. The embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Embodiments relate to systems and methods for sealing MEMS devices with one or more thin film stack. In one embodiment, the thin film stack has enhanced optical absorption, allowing light energy to be delivered precisely to the interface of two materials to be bonded. In another embodiment, heat generated from absorbed laser light is confined to a submicron-thick layer between the two materials to be sealed together. In yet another embodiment, the thin film stack is less than 200 nm thick. The composition and thickness of layers comprising the light absorptive thin film stack can advantageously be tailored to absorb a high percentage of light of a chosen wavelength. In some embodiments of the light absorptive thin film stack, optical absorption is between about 90% and about 100% at chosen wavelengths.

Embodiments of light absorptive films described herein can be very thin, with submicron thicknesses and very high optical absorbance. The thinness and enhanced optical absorbance of the light absorptive film stacks described herein can reduce the required laser light intensity necessary to bond two materials, which in turn reduces the amount of stray absorbance in the materials above and below the interface to be bonded. Thus, in one embodiment, laser light of a specific wavelength can be selected such that the light can freely pass through a substrate, then the composition and thickness of the thin film stacks described herein can be adjusted such that absorption only takes place at a desired location. Due to their thinness and enhanced absorption capabilities, the light absorptive thin film stacks according to certain embodiments may not affect the mechanical properties of the device and can incur less stress variations in the bonded materials.

As used herein, the term "about" or "approximately" means within an acceptable error range for the particular value as determined by one of ordinary skill in the art, which will depend in part on how the value is measured or determined, e.g., the limitations of the measurement system. For example, "about" can mean within 1 or more than 1 standard deviations, per the practice in the art. Alternatively, "about" can mean a range of up to 20%, preferably up to 10%, more preferably up to 5%, and more preferably still up to 1% of a given value. In one embodiment, an approximately 1 nanometer thin film means a thin film that is 1 nanometer plus or minus 1%. In another embodiment, an approximately 1 nanometer thin film means a thin film that is 1 nanometer plus or minus 5%. Where particular values are described in the application and claims, unless otherwise stated the terms "about" and "approximately" meaning within an acceptable error range for the particular value should be assumed.

One interferometric modulator display embodiment comprising an interferometric MEMS display element is illustrated in FIG. 1. In these devices, the pixels are in either a bright or dark state. In the bright ("relaxed" or "open") state, the display element reflects a large portion of incident visible light to a user. When in the dark ("actuated" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) to form columns deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device. Note that FIG. 1 may not be to scale. In some embodiments, the spacing between posts 18 may be on the order of 10-100 um, while the gap 19 may be on the order of <1000 Angstroms.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential (voltage) difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by actuated pixel 12b on the right in FIG. 1. The behavior is the same regardless of the polarity of the applied potential difference.

FIGS. 2 through 5 illustrate one exemplary process and system for using an array of interferometric modulators in a display application.

Figure 2:
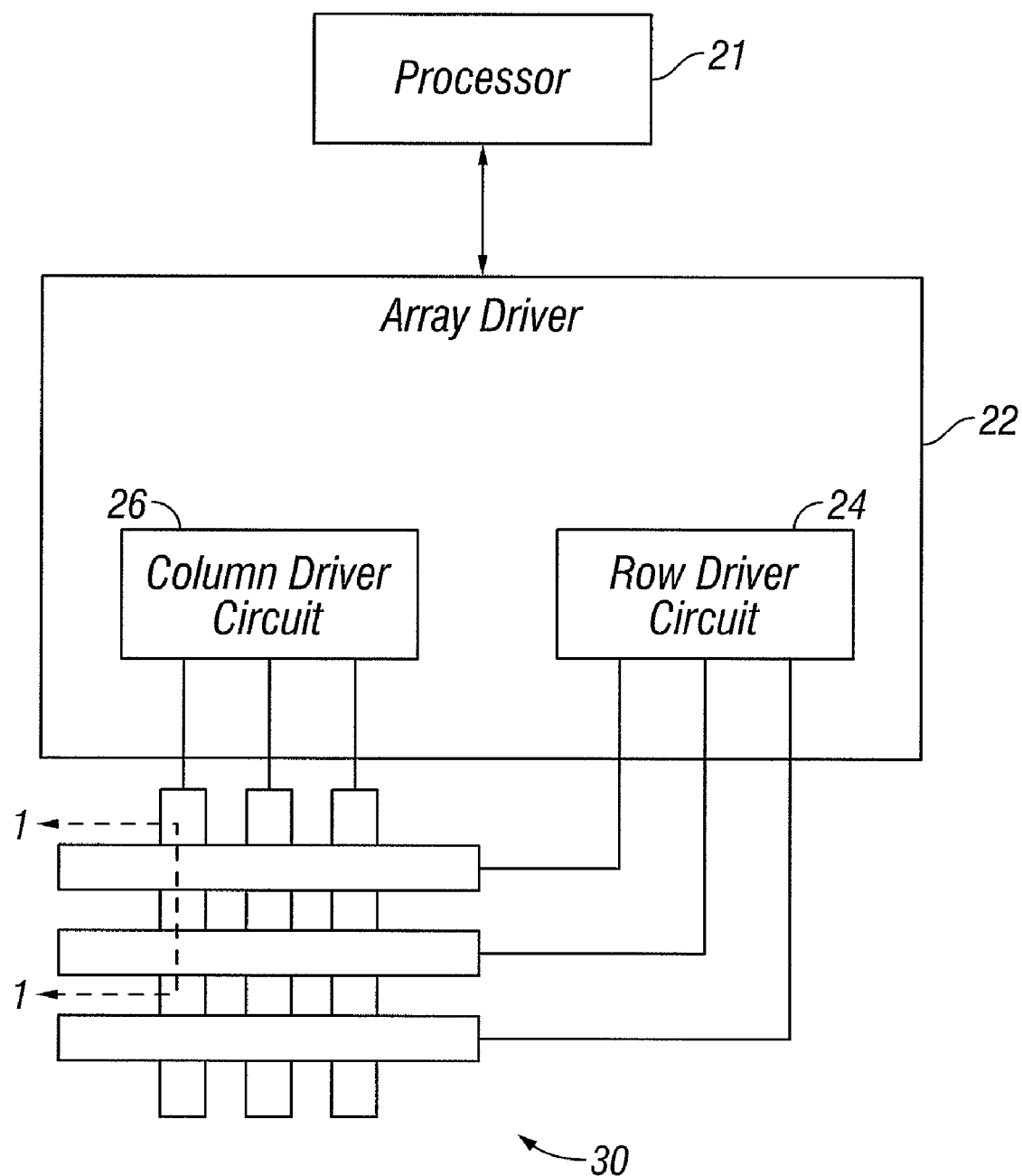
FIG. 2 is a system block diagram illustrating one embodiment of an electronic device incorporating a 3×3 interferometric modulator display.

FIG. 2 is a system block diagram illustrating one embodiment of an electronic device that may incorporate interferometric modulators. The electronic device includes a processor 21 which may be any general purpose single- or multi-chip microprocessor such as an ARM®, Pentium®, 8051, MIPS©, Power PC®, or ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. Note that although FIG. 2 illustrates a 3×3 array of interferometric modulators for the sake of clarity, the display array 30 may contain a very large number of interferometric modulators, and may have a different number of interferometric modulators in rows than in columns (e.g., 300 pixels per row by 190 pixels per column).

Figures 3, 4:
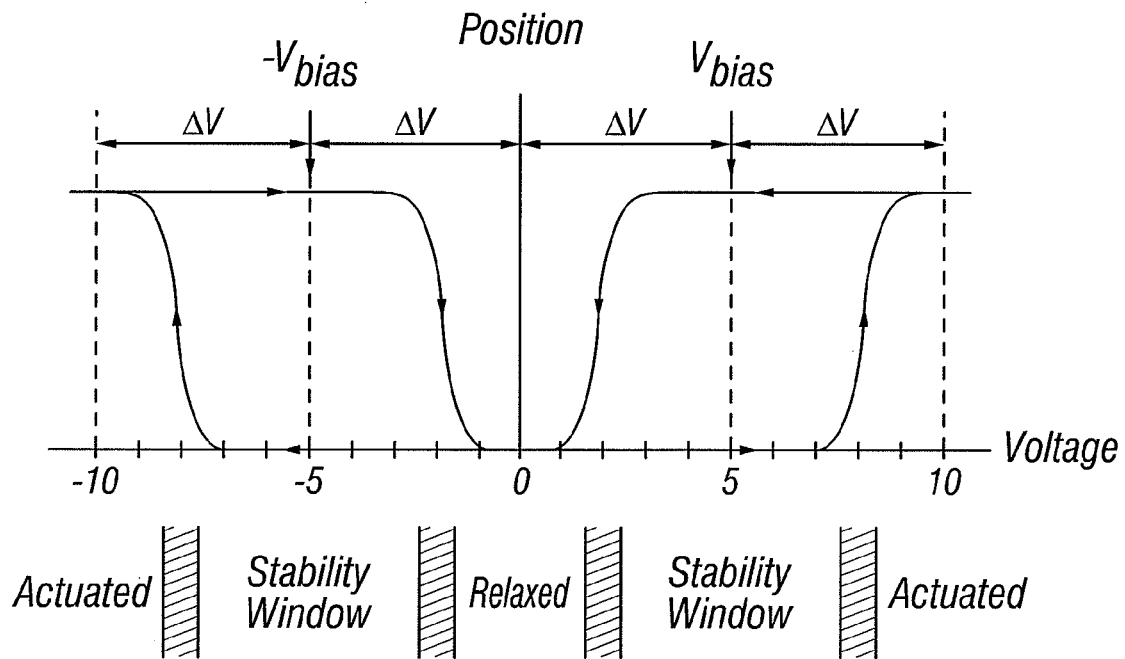
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIG. 3 is a diagram of movable mirror position versus applied voltage for one exemplary embodiment of an interferometric modulator of FIG. 1. For MEMS interferometric modulators, the row/column actuation protocol may take advantage of a hysteresis property of these devices as illustrated in FIG. 3. An interferometric modulator may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state or bias voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

As described further below, in typical applications, a frame of an image may be created by sending a set of data signals (each having a certain voltage level) across the set of column electrodes in accordance with the desired set of actuated pixels in the first row. A row pulse is then applied to a first row electrode, actuating the pixels corresponding to the set of data signals. The set of data signals is then changed to correspond to the desired set of actuated pixels in a second row. A pulse is then applied to the second row electrode, actuating the appropriate pixels in the second row in accordance with the data signals. The first row of pixels are unaffected by the second row pulse, and remain in the state they were set to during the first row pulse. This may be repeated for the entire series of rows in a sequential fashion to produce the frame. Generally, the frames are refreshed and/or updated with new image data by continually repeating this process at some desired number of frames per second. A wide variety of protocols for driving row and column electrodes of pixel arrays to produce image frames may be used.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
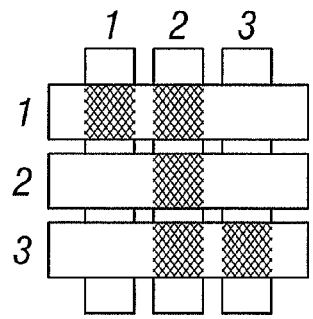
FIGS. 5A and 5B illustrate one exemplary timing diagram for row and column signals that may be used to write a frame of display data to the 3×3 interferometric modulator display of FIG. 2.
Figure 5B:
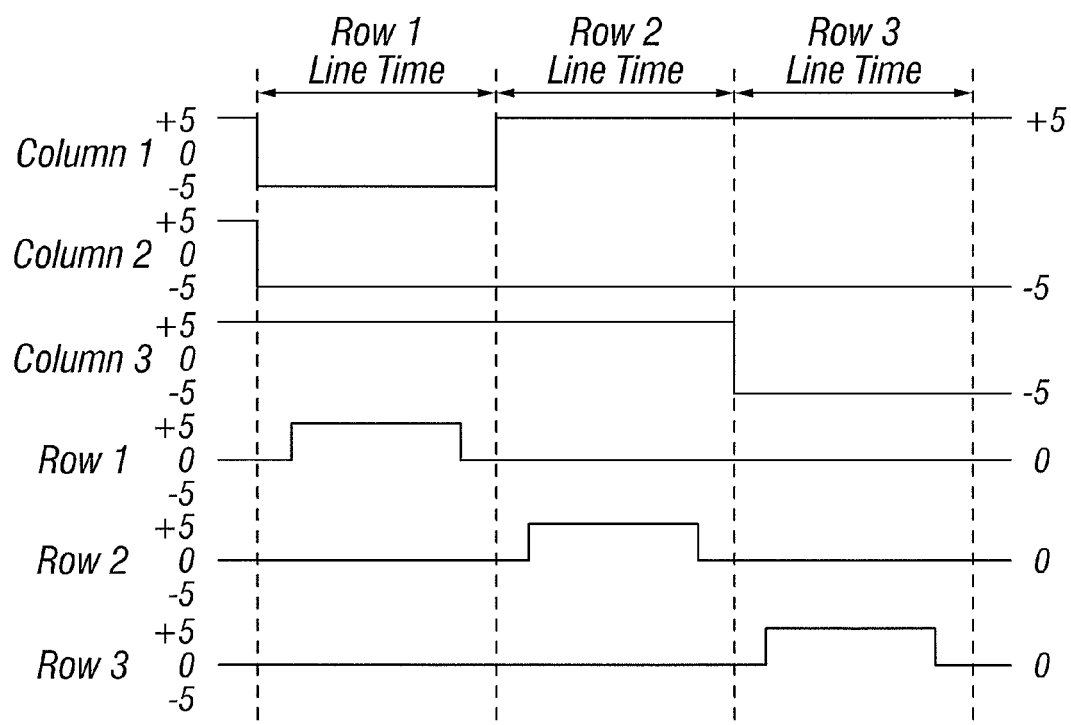

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are initially at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. The same procedure can be employed for arrays of dozens or hundreds of rows and columns. The timing, sequence, and levels of voltages used to perform row and column actuation can be varied widely within the general principles outlined above, and the above example is exemplary only, and any actuation voltage method can be used with the systems and methods described herein.

Figure 6A:
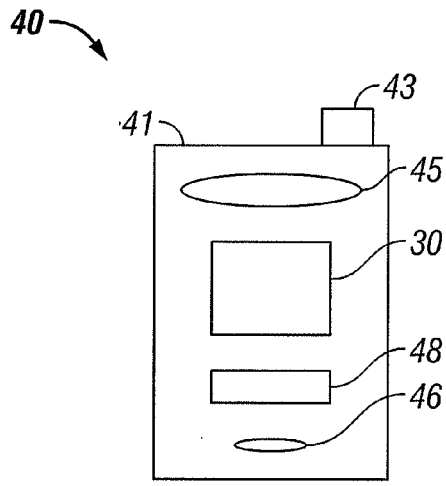
FIGS. 6A and 6B are system block diagrams illustrating an embodiment of a visual display device comprising a plurality of interferometric modulators.
Figure 6B:
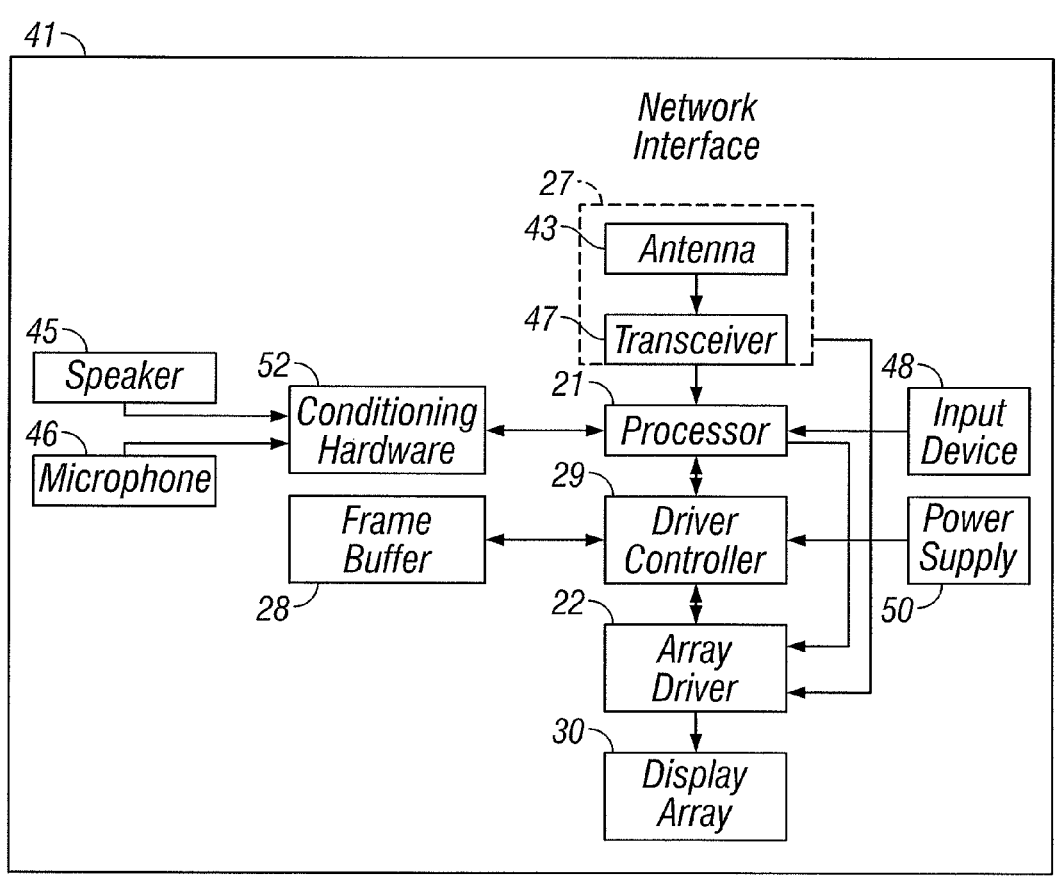

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, W-CDMA, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. The above-described optimization may be implemented in any number of hardware and/or software components and in various configurations.

Figure 7A:
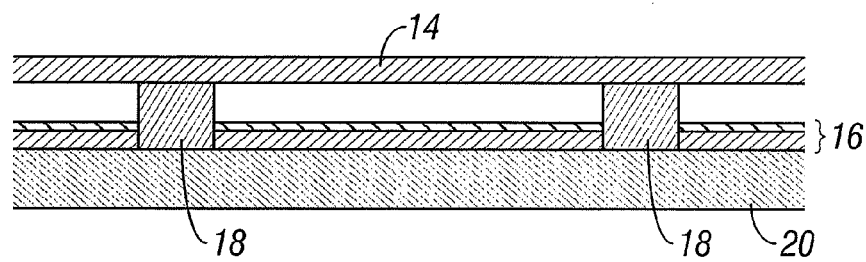
FIG. 7A is a cross section of the device of FIG. 1.
Figure 7B:
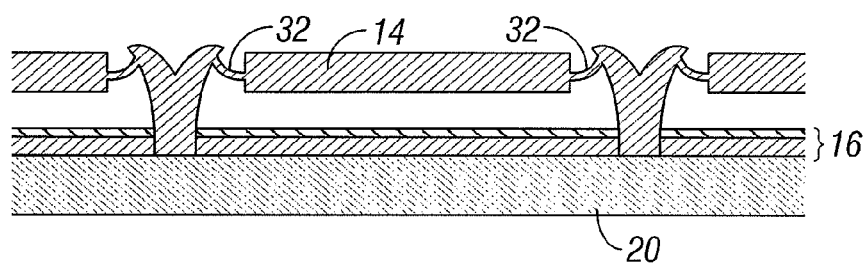
FIG. 7B is a cross section of an alternative embodiment of an interferometric modulator.
Figure 7C:
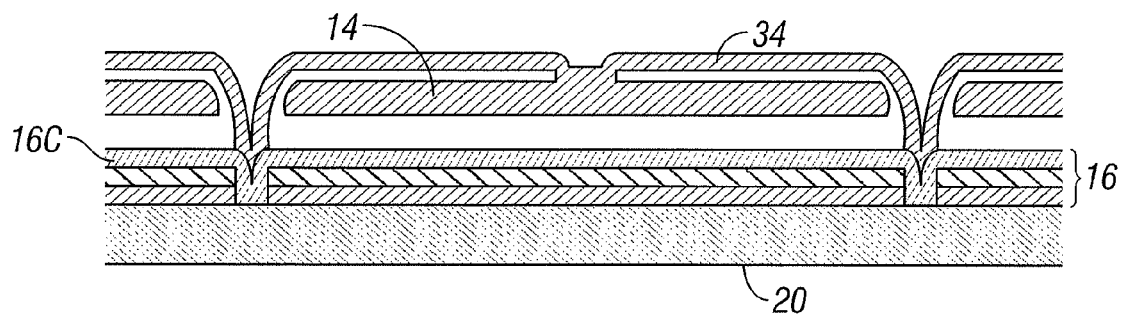
FIG. 7C is a cross section of another alternative embodiment of an interferometric modulator.
Figure 7D:
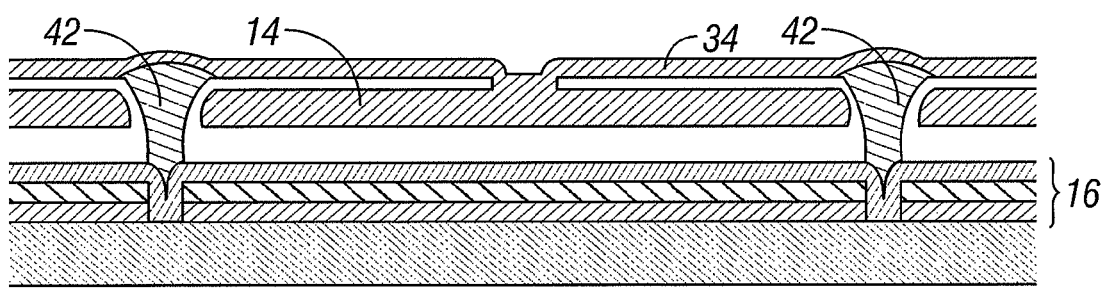
FIG. 7D is a cross section of yet another alternative embodiment of an interferometric modulator.
Figure 7E:
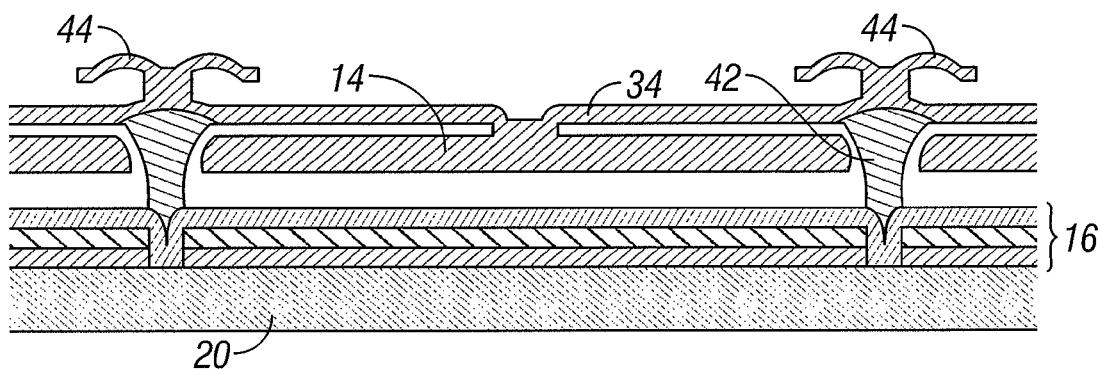
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 of each interferometric modulator is square or rectangular in shape and attached to supports at the corners only, on tethers 32. In FIG. 7C, the moveable reflective layer 14 is square or rectangular in shape and suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. For example, such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Light Absorptive Thin Film Stacks

Figure 8:
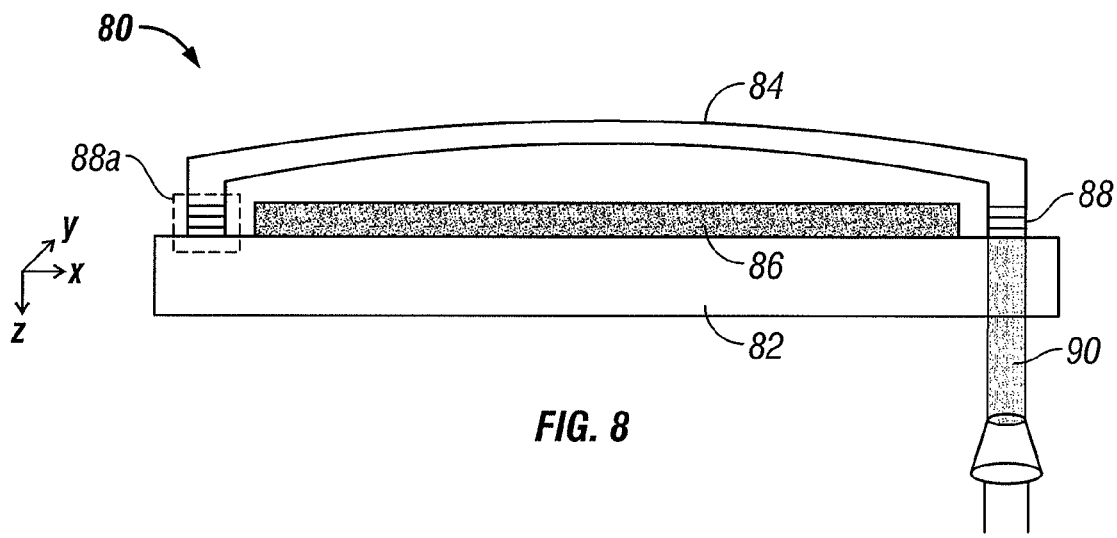
FIG. 8 is a cross-sectional view of an embodiment of an interferometric modulator with a light absorptive thin film stack disposed between a substrate and a backplate.

A schematic of a basic package structure for a MEMS device with a light absorptive thin film stack or light absorptive thin film interferometric stack is illustrated in FIG. 8. As shown in FIG. 8, a basic package structure 80 includes a substrate 82 and a backplate cover or "cap" 84, wherein an interferometric modulator array 86 is formed on the substrate 82. This cap 84 is also called a "backplate." A light absorptive thin film stack 88 is disposed between the substrate 82 and the backplate 84. Laser light 90 is applied to the thin film stack 88 to seal the substrate 82 to the backplate 84 to form the package structure 80. While laser light 90 is illustrated in FIG. 8, it will be understood that the light applied to the thin film stack 88 need not be laser light. The thin film stack 88 can absorb a spectrum of light having multiple wavelengths. In the embodiment illustrated in FIG. 8, the laser light 90 passes through the substrate 82 before it is incident on the thin film stack 88. Following the application of the laser light 90, the interferometric modulator array 86 is encapsulated by the substrate 82, backplate 84, and a light-treated thin film seal (not shown). In some embodiments, the light-treated thin film seal comprises a laser-light-treated thin film seal.

The light absorptive thin film stack 88 can localize light absorption and confine heat generation to a submicron thick layer located at the interface of a substrate 82 and a backplate 84 to be bonded together. In some embodiments, the thickness of the thin film stack is less than 200 nm.

In one embodiment, the laser-treated thin film seal hermetically seals the package structure 80. Generally, it is desirable to minimize the permeation of water vapor into the package structure 80 and thus control the environment inside the package structure. Hermetically sealing the package, for example, can ensure the environment remains constant over the lifetime of the device. When the humidity within the package exceeds a level beyond which surface tension from the moisture becomes higher than the restoration force of a movable element (not shown) in the interferometric modulator, the movable element may become permanently stuck to the surface. Such stiction of movable membranes renders the device inoperable. In the case of an OLED device, moisture can cause corrosion of metal electrodes, rendering the device inoperable.

The substrate 82 may be a semi-transparent or transparent substance capable of having thin film, MEMS devices built upon it. Such transparent substances include, but are not limited to, glass, plastic, and transparent polymers. In other embodiments, the substrate comprises glass, plastic, metal, or silicon. The interferometric modulator array 86 may comprise membrane modulators or modulators of the separable type. The skilled artisan will appreciate that the backplate 84 may be formed of any suitable material, such as glass, metal, foil, polymer, plastic, ceramic, or semiconductor materials (e.g., silicon). In one embodiment, the substrate 82 comprises glass with a low melting point, such as glass comprising boron oxide or calcium oxide.

The light absorptive thin film stack 88 can advantageously create a thin film seal between the same, similar, or dissimilar materials. Materials that can be bonded together using laser-treated light absorptive thin film stacks include glass, metal, semiconductor materials (e.g., silicon), and plastic. In one embodiment, for example, a laser-treated thin film seal joins a substrate 82 comprising glass to a backplate 84 which also comprises glass. In another embodiment illustrated in FIG. 9, a laser light 90 is applied to a light absorptive thin film stack 98b to seal a backplate 85 comprising glass to a wall 92 comprising metal. The wall 92 can alternatively comprise liquid crystal polymer (LCP), a sealant, or any other suitable material. Any suitable liquid crystal polymer can be used. Examples include ZENITE® LCP by DuPont™ and VECTRA® LCP A950 by Ticona. In the embodiment shown in FIG. 9, the laser light 90 passes through the backplate 85 before it is incident on the thin film stack 98b. Thus, the light absorptive thin film stack 98b can seal a first piece comprising glass, plastic, metal, or silicon to a second piece comprising glass, plastic, metal, or silicon. In another embodiment described in greater detail below, laser light is applied to a light absorptive thin film stack and at least one interlayer disposed between two materials to be bonded. Bonding can occur at the outer surfaces of the at least one interlayer, further minimizing detrimental effects commonly associated with laser sealing.

In yet another embodiment, the wall 92 is formed on the backplate 85, with thin film stacks 98a, 98b disposed on the substrate 82. As a result, thin film stacks 98a, 98b can be advantageously fabricated during device processing. Further, the wall 92 and the backplate 85 can be fabricated using simpler procedures that need not be compatible with MEMS or OLED microfabrication procedures. It will also be understood that laser light can be applied through substrate 82 if desired, for example if the material comprising the wall 92 is not transmissive or is less transmissive than substrate 82.

Light absorptive thin film stacks described herein can efficiently convert light energy, such as energy from a laser light, into heat to package and seal devices. Advantageously, selecting and using a particular combination of materials in the light absorptive thin film stack can confine heat generated by the light to a small volume, such as at the interface between two materials to be joined or sealed together. In addition, the composition and thickness of materials in the thin film stack can be selected to ensure localized heat generation for a particular wavelength of light, such as laser light. Thus, a preferred spectrum or wavelength of light for use in the sealing and packaging methods described herein can be chosen, then a light absorptive thin film stack can be selected. In one embodiment, the selected thin film stack absorbs all or a substantial portion of incident light of the chosen wavelength, such that the resulting heat generation is localized in a small volume at the bonding interface.

The ability to select a light absorptive thin film stack based on a particular, desired wavelength is particularly advantageous, because localizing light absorption to a particular, defined interface is not always possible using conventional methods. For example, ultraviolet laser light, with a smaller wavelength than infrared light, may be capable of focusing light in a small area such as an interface, ensuring light absorption is localized at that interface. However, the ability to focus the ultraviolet light on the interface may be limited by the wavelength of the light. At reduced wavelengths, the substrate though which the light travels may absorb more of the light, such that it may not be possible to get a sufficient amount of laser light to the interface. Embodiments of thin film stacks described herein offer the ability to choose light of a particular wavelength and still ensure light is absorbed and heat is generated at the desired interface.

It should be realized that sealing lasers may pass through surfaces that are not transparent to visible light. In one example embodiment, an infrared laser is selected to seal a substrate comprising silicon to a backplate. An infrared laser with, for instance, a 1.3 micron wavelength can pass through silicon in order to seal the silicon substrate to the backplate. A light absorptive thin film stack that can absorb all or a substantial part of the infrared laser light is selected and applied to the substrate or the backplate. Infrared laser light is applied through the substrate to the tailored thin film stack, which absorbs the light and generates heat precisely at the interface to be bonded. In another embodiment, the selected thin film stack is characterized by strong optical absorption at a low cost laser wavelength, such as an Nd:YAG laser with a 1.06 micron wavelength.

Figure 10:
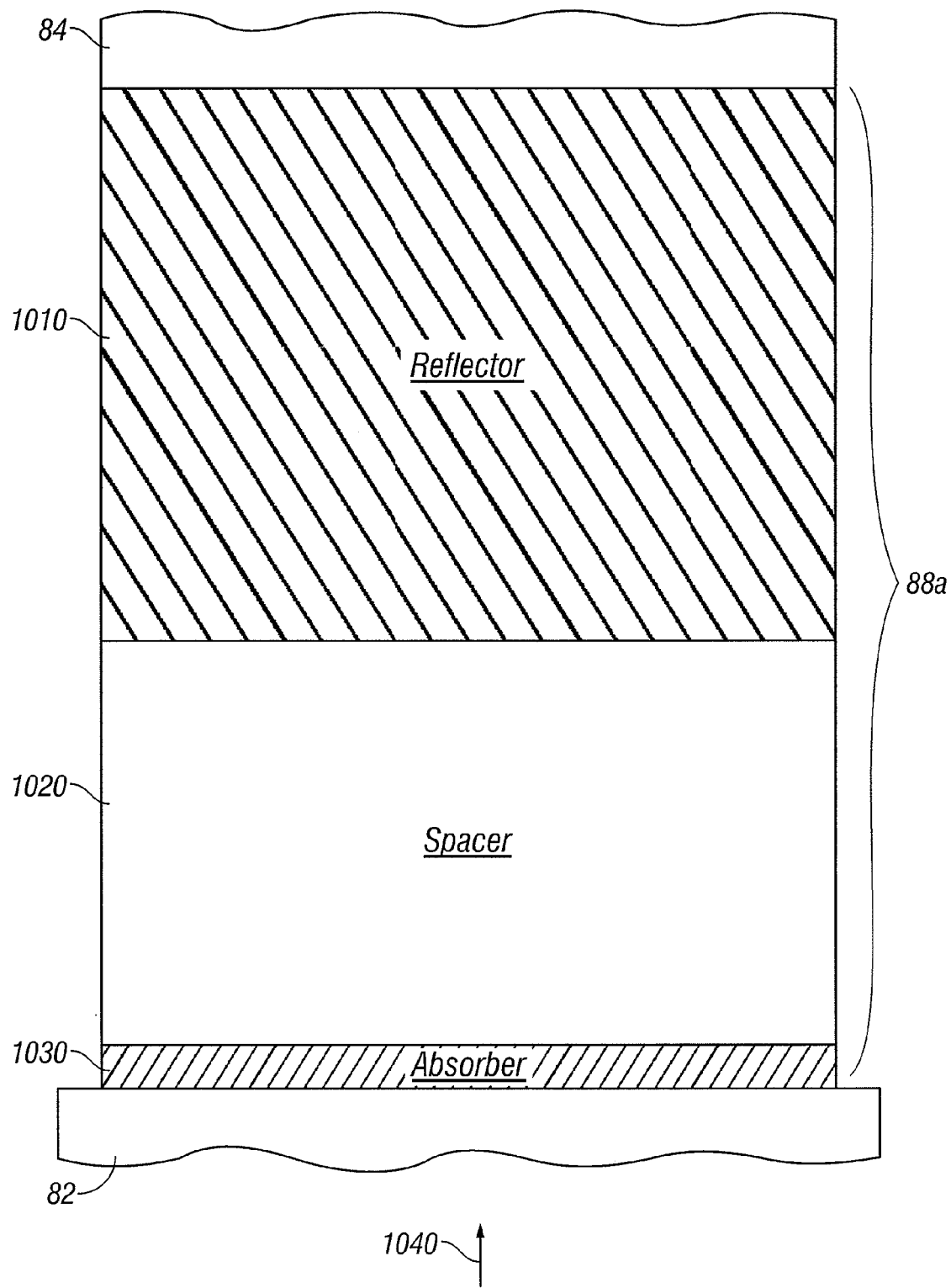
FIG. 10 is an enlarged view of the light absorptive thin film stack of FIG. 8.

FIG. 10 illustrates an enlarged view of a light absorptive thin film stack 88a of FIG. 8 prior to laser treatment. The thin film stack 88a comprises a reflector or reflective layer 1010, a spacer or spacer layer 1020, and an absorber or absorber layer 1030. The thin film stack 88a is disposed between the substrate 82 and the backplate 84, such that the reflective layer 1010 is located proximate to the backplate 84, the absorber layer 1030 is located proximate to the substrate 82, and the spacer layer 1020 is sandwiched between the reflective layer 1010 and the absorber layer 1030. Thus, in one embodiment, one side of the thin film stack 88a comprises the absorber layer 1030 and the other side of the thin film stack 88a comprises the reflective layer 1010.

As illustrated in FIG. 10, laser light is applied in the direction indicated by arrow 1040 to the side of the thin film stack 88a comprising the absorber layer 1030 and enters the thin film stack 88a. The laser light is incident on the absorber layer 1030, then the spacer layer 1020 and the reflective layer 1010. Without being bound to any particular theory, it is believed that the laser light, or a substantial amount of the laser light, reflects off of the reflective layer 1010 and travels back through the thin film stack 88a. In some aspects, all or a substantial amount of the laser light does not travel into the backplate 84, such that light absorption and heat generation is localized at the interface of the substrate 82 and the backplate 84. The 3D spatial confinement of heat generation from absorbed light in the thin film stack 88a as described herein can reduce the amount of heat that reaches devices close to the bond region, as well as detrimental heating effects on the substrate 82 and the backplate 84 as they are bonded. As described above, such heating can lead to built-in stresses and poor bond reliability.

The localized heat generation leads to melting in the vicinity of the interface between the substrate 82 and the backplate 84, and the formation of a bond between the substrate 82 and the backplate 84. In one embodiment, a portion of the substrate 82 and/or a portion of the backplate 84 that is proximate to the heated thin film stack melts. This molten material can act as a glue, flowing and spreading to conform to the topography of adjacent surfaces before solidifying back to a solid state. Thus, light absorptive thin film stacks described herein can be used to bond non-flat surfaces. In addition, the use of contacting surfaces or interlayers to enhance formation of a bond between the substrate 82 and the backplate 84 is discussed in greater detail below.

Persons of skill in the art will understand that the embodiment illustrated in FIG. 10 is not limiting. For example, instead of being disposed between a substrate 82 and a backplate 84, the thin film stack can be disposed between one of substrate 82 or backplate 84 and a wall disposed on a substrate. The wall may comprise any suitable material, including but not limited to LCP, metal, or sealant materials forming a perimeter seal.

In the embodiment illustrated in FIG. 10, the light absorptive thin film stack is disposed such that the reflector is proximate to the backplate, the absorber is proximate to the substrate, and laser light is applied through the substrate such that it is incident on the side of the thin film stack comprising the absorber. In another embodiment, the light absorptive thin film stack is disposed such that the reflector is proximate to the substrate and the absorber is proximate to the backplate. Laser light is applied through the backplate such that it is incident on the side of the thin film stack comprising the absorber.

Thus, the location of the thin film stack, and the order and/or arrangement of the layers comprising the thin film stack, can be adjusted to accommodate the application of laser light through a material with advantageous optical properties. For example, in one embodiment a substrate comprising a transparent or semi-transparent material and a backplate comprising an opaque material are bonded according to thin film stack sealing methods described herein. The thin film stack can be advantageously disposed between the substrate and the backplate such that the absorber is proximate to the substrate and laser light is applied through the substrate. Thus, laser light is applied through the transparent or semi-transparent material, rather than the opaque material.

Persons of skill in the art will understand that the thin film stack can interferometrically modulate light. In one embodiment, the thin film stack is a light absorptive thin film interferometric stack. In another embodiment, the thin film stack is a non-movable or static interferometric element, as opposed to the interferometric modulator array 86 illustrated in FIG. 8, which includes a movable component. In yet another embodiment, the thin film stack is an interferometric modulator configured to operate in one state. In still another embodiment and with reference to FIG. 10, the absorber layer 1030 is a partial reflector, the spacer layer 1020 is a dielectric layer, and the reflector layer 1010 is a complete reflector in a light absorptive thin film interferometric stack. Components of the thin film stacks described herein can therefore be selected and designed to enhance absorption of a particular wavelength of light using interferometric principles described in greater detail with respect to FIG. 1.

A variety of light absorptive thin film stacks can be designed such that incident light, such as but not limited to laser light, is almost completely converted to heat right at the interface of two materials to be bonded. The composition and thickness of the layers in the light absorptive thin film stack can be modified so that the localized conversion of light to heat occurs regardless of the chosen laser light. In one embodiment illustrated in FIG. 10, for example, a 532-nm laser light is chosen to bond a substrate 82 and a backplate 84. The composition and thickness of the layers of the thin film stack 88a are then selected and optimized to absorb between about 90 percent and about 100 percent of the 532-nm light incident on the thin film stack 88a.

Table 1 illustrates the selection of different materials for use in one embodiment of a light absorptive thin film stack. The reflective layer comprises a 100-nm thick layer of aluminum according to one embodiment. The reflective layer is not limited to aluminum, however, and can comprise any suitable metal. The reflective properties of the materials comprising the layer can affect the amount of light that is absorbed by the absorber layer. For example, highly reflective metals such as aluminum may reflect as much as 99% of light back to the absorber layer, while other metals such as nickel may reflect less light. In one embodiment, the reflective layer comprises a metal whose melting temperature is higher than the glass transition temperature of glass. The thickness of the reflective layer can be varied to allow for enhanced optical absorbance for lights of different wavelengths.

TABLE 1

|  | Material | Thickness |
| --- | --- | --- |
| Reflective Layer | Aluminum | about 100 nm |
| Spacer Layer | Silicon dioxide | about 73 nm |
| Absorber Layer | Molybdenum | about 5 nm |
| Incidence Medium | Glass | any thickness |

The spacer layer may comprise a layer of silicon dioxide that is approximately 73-nm thick. The spacer layer can comprise any suitable material, however, such as one or a mixture of transparent inorganic or organic materials. Such inorganic and organic materials include, but are not limited to, metal oxides, nitrides, and polymers. The thickness of the spacer layer can be adjusted to maximize absorption of light in the absorber layer for a particular wavelength of light.

The absorber layer may comprise molybdenum with a thickness of approximately 5 nm. The thickness can be varied, however, to optimize the optical absorbance properties of the thin film stack. In addition, other materials can be used in the absorber layer, such as chromium, molybdenum-chromium alloys and silver. The total thickness of the thin film is approximately 178 nanometers in one embodiment. Thus, the light absorptive thin film stack summarized in Table 1 has a total thickness less than 200 nm as well as enhanced optical absorption capabilities.

In certain aspects, the layers in the thin film stack can serve different purposes when laser light is applied to the thin film stack. The material composition and thickness of the reflective layer can be chosen such that the reflective layer stops light from traveling to the material proximate to the reflective layer. The material composition and thickness of the spacer layer can be chosen such that the spacer layer melts when laser light is applied to it, thus helping to create a bond between the two materials to be sealed. An absorber layer can be chosen such that the absorber layer heats up when laser light is applied to it, thereby helping convert light energy into heat in a confined area to melt the spacer layer. Persons of skill in the art will understand that the layers can serve multiple purposes, such that, for example, one or more of the three layers can absorb laser light and heat up, and one or more of the three layers can melt to create a bond line sealing two materials.

Figure 9:
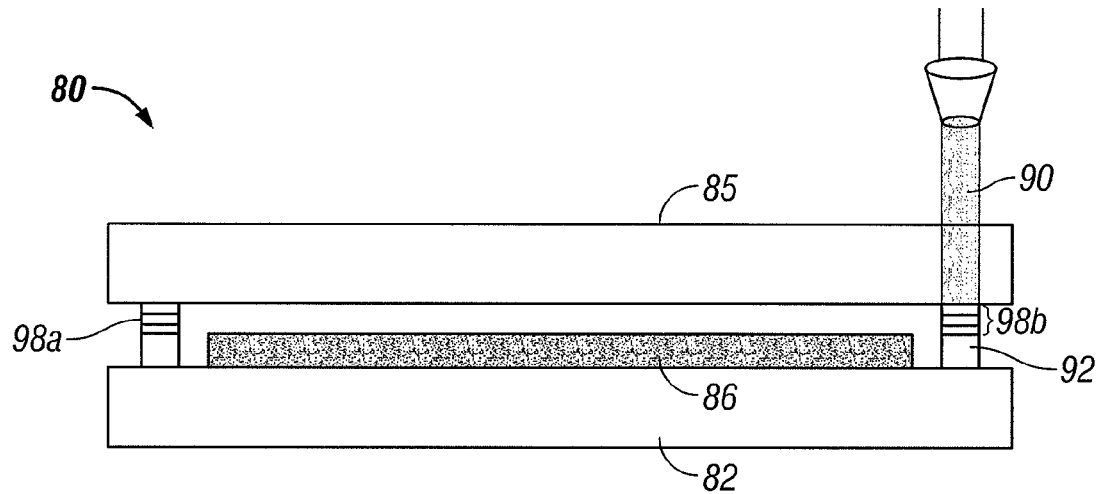
FIG. 9 is a cross-sectional view of an embodiment of an interferometric modulator with a light absorptive thin film stack disposed between a backplate and a metal wall disposed on a substrate.

Light absorptive thin film stacks can be applied to or coated on various surfaces. Referring to FIG. 9, for example, the thin film stack 98b (comprising the absorber layer, the spacer layer, and the reflector layer) can be coated on the wall 92, such that incident laser light contacts the absorber layer first. The backplate 85 can then be placed on top of the thin film stack. Alternatively, the thin film stack 98b can be coated on the backplate 85, such that incident laser light contacts the absorber layer first. The thin film stack-coated backplate can then be placed on top of the wall 92. Alternatively, the wall 92 can be formed on the backplate, then coated with a thin film stack 98b such that incident laser light contacts the absorber layer first. The backplate 85 can then be placed on top of the substrate 82.

Referring again to FIG. 10, the light absorptive thin film stack, can be coated on the substrate 82. The backplate 84 can then be placed on top of the thin film stack-coated substrate 82, such that the backplate 84 contacts the reflective layer 1010. In some embodiments, there is a small air gap between the backplate 84 and the reflective layer 1010 before the application of laser light and formation of a bond. Laser light is then applied in the direction of arrow 1040, through the substrate 82 to the thin film stack. As described above, heat is generated and conducted throughout the thin film stack, forming a bond between the backplate 84 and the reflective layer 1010.

In another embodiment, the light absorptive thin film stack is coated on the backplate 84. The thin film stack-coated backplate 84 is then placed on top of the substrate 82 such that the substrate 82 contacts the absorber layer 1030. In some embodiments, there is a small air gap between the substrate 82 and the absorber layer 1030 before the application of laser light and formation of a bond. Laser light is applied in the direction of arrow 1040, through the substrate 82 to the light absorptive thin film stack, forming a bond between the substrate 82 and the absorber layer 1030. In some embodiments, the backplate 84 is placed on top of the substrate 82 in a reduced pressure atmosphere, then laser light is applied to the thin film stack.

Thus, the light absorptive thin film stacks can be advantageously applied such that either the absorber layer or the reflective layer is proximate to the surface to which the thin film stack is to be bonded; in either configuration, laser light can be applied such that light contacts the absorber layer first. Either the absorber layer or the reflective layer can be proximate to the bonding surface because heat generation in the absorber layer leads to immediate or near instantaneous heating of the entire film stack, which is very thin, in some embodiments less than 200 nm, in other embodiments less than 2000 nm or 100 nm. As a result, a bond can be achieved from either side of the thin film stack.

The light absorptive thin film stack can serve multiple functions. In addition to absorbing light, the thin film stack can be configured to form a strong bond. For example, the thin film stack can include a contacting surface or interlayer that is chemically compatible with the surface to which the thin film stack is to be bonded. In some embodiments, a bond is to be formed between a substrate and a thin film stack coated on a backplate. A contacting surface is located on the absorber layer of the thin film stack. Alternatively, the contacting surface can be coated on the substrate, such that the absorber layer contacts the contacting surface when the thin-film coated backplate is placed on top of the substrate. In another embodiment, a bond is to be formed between a backplate and a thin film stack coated on a substrate. A contacting surface can be located on the reflective layer of the thin film stack. Alternatively, the contacting surface can be coated on the backplate, such that the reflective layer contacts the contacting surface when the backplate is placed on top of the thin-film coated substrate.

In the above-described embodiments where a bond is formed between the absorber layer of a thin film stack and a substrate, the contacting surface disposed between the absorber layer and the substrate is heated by the absorber layer and ensures the absorber layer forms a bond with the substrate. In one embodiment, the contacting surface comprises silicon dioxide to ensure the absorber layer forms a strong bond with a glass substrate. In aspects that do not use a contacting layer, the absorber layer material will form a direct bond to the glass surface. In aspects that use a silicon dioxide contacting surface, the strength and quality of the bond between the absorber layer and the glass substrate may be further improved. In another embodiment, electrodes are disposed on a glass substrate. Bonding such an electrode-covered glass substrate directly to the absorber layer of the thin film stack may cause an electrical short. Advantageously, a contacting surface comprising silicon dioxide can be coated on the electrode-covered substrate, ensuring a bond is formed between the absorber layer and the substrate without shorting.

The contacting surface provides similar benefits in embodiments where a bond is formed between a reflective layer of a thin film stack and a substrate and/or backplate. Thus, a silicon dioxide contacting layer may be disposed between the reflective layer of a thin film stack and a substrate and/or backplate, to ensure a strong bond is formed between the molecules of the reflective layer (aluminum molecules, for example) and the molecules of the substrate and/or backplate.

The contacting surface can be approximately 5 nm thick. Other thicknesses sufficient to change the surface energy properties of the materials to be bonded can also be used. It will be understood that other interlayers, such as LCP interlayers discussed in greater detail below, can be used in addition to or in lieu of a contacting surface. Such interlayers can be thicker than the contacting surfaces just described. For example, an interlayer can be as thick as about 10 microns to about 100 microns, whereas the contacting surface may only be thick enough to change the surface properties of a material, such as 5 nm. The contacting surface can serve additional functions, as well. In some embodiments, for example, a silicon dioxide contacting surface that is about 5 nm, about 10 nm, about 15 nm, or about 100 nm is applied to a thin film stack to protect the thin film stack from damage during the manufacturing process.

In some aspects, one or more factors contribute to the formation of a bond between a thin film stack and a substrate such that there is no longer an air gap between the thin film stack and the substrate. The factors can include the light absorptive properties of the thin film stack, application of laser light to the thin film stack in a modified pressure environment, and a contacting surface located between the thin film stack and the surface to which the thin film stack is to be bonded.

In addition to providing high optical absorption, the layers in the thin film stack can also meet other criteria that are advantageous in package device sealing technologies. Materials with good adhesion properties and advantageous coefficients of thermal expansion, in addition to advantageous absorbance properties, can be selected. For example, molybdenum is commonly used to facilitate adhesion to glass substrates, and silicon dioxide has similar chemical and thermal properties to glass.

Figure 11:
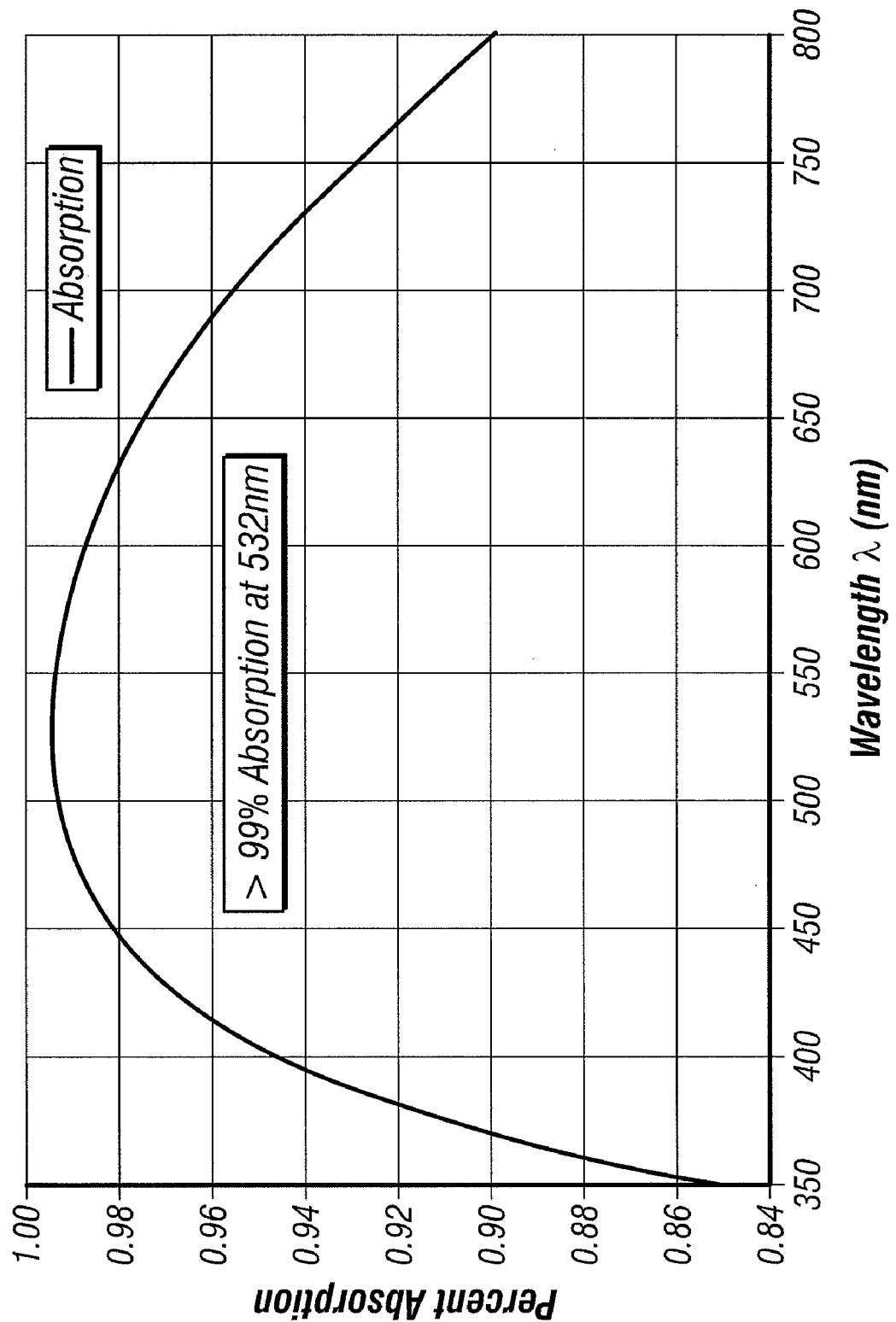
FIG. 11 is a line graph depicting absorption of a 3-layer light absorptive thin film stack.

The graph shown in FIG. 11 illustrates the optical absorption capability of the light absorptive thin film stack summarized in Table 1. In this embodiment, the thin film stack comprises an approximately 5-nm thick layer of molybdenum, an approximately 73-nm thick layer of silicon dioxide, and an approximately 100-nm thick layer of aluminum. The layer of molybdenum is proximate to a glass medium. Laser light of varying wavelengths is applied to the thin film stack through the glass medium, and is incident on the absorber layer comprising molybdenum. The graph illustrates the relationship between percent optical absorption of the thin film stack and the wavelength of light applied to the thin film stack. The thin film stack absorbs between about 84 percent and about 90 percent of incident light of wavelengths between about 350 and about 800 nanometers. Advantageously, the thin film stack absorbs more than about 99 percent of a 532-nm wavelength light. The thin film stack embodiment summarized in Table 1 is therefore optimized to absorb light from a 532-nm wavelength laser.

Figure 12:
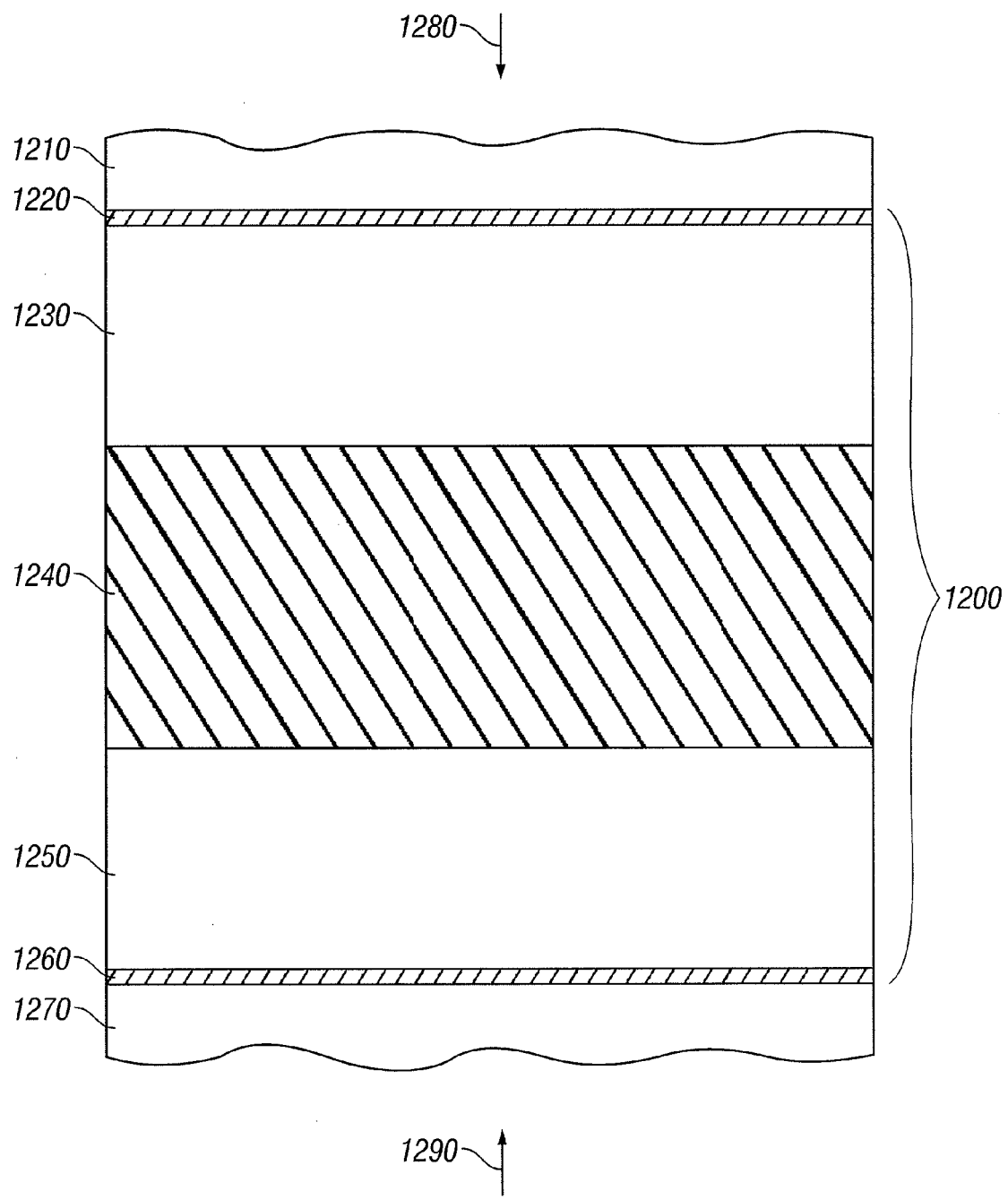
FIG. 12 is an enlarged view of another embodiment of a light absorptive thin film stack.

FIG. 12 is an enlarged view of another embodiment of a light absorptive thin film stack that can be used to create a seal between the same, similar, or dissimilar materials. In this embodiment, a light absorptive thin film stack 1200 includes more than three layers. The layers, shown from top to bottom, comprise a first absorber 1220, a first spacer 1230, a reflector 1240, a second spacer 1250, and a second absorber 1260. The thin film stack is disposed between a first material 1210 and a second material 1270. The first and second materials 1210, 1270 can comprise glass, metal, semiconductor material (e.g., silicon), and/or plastic. Laser light can be applied in the directions indicated by arrows 1280 and 1290 to one or both of the first and second materials 1210, 1270, such that laser light is incident on either the first absorber 1220, the second absorber 1260, or both. In one embodiment, laser light is applied to both absorbers 1220, 1260; travels though both spacers 1230, 1250; and reflects off of reflector 1240. As described above, the absorption of light and generation of heat in the thin film stack 1200 melts the first material 1210 and the second material 1270 at their interface, thus creating a bond line and sealing the two materials together.

Embodiments of the light absorptive thin film stacks can include reflective layers coated with additional materials that satisfy other device-specific requirements, in addition to light absorption and heat generation described above. For example, the reflector can be coated with a dielectric layer. The dielectric layer can provide electrical passivation where a material is bonded to a substrate with exposed electrodes, for example. In some embodiments, materials with superior surface and/or adhesion properties are used. One example of such a material is a thin silicon oxide layer coated on the reflective layer to render the heated surface glass-like. Such a silicon oxide coating may also provide better bonding with the surface proximate to the reflective layer, or better bonding with an interlayer disposed between the thin film stack and the material to be bonded. In other embodiments, the reflective layer is coated with materials that protect against corrosion and/or degradation during bonding. Such coatings can prevent chemical attack of a thin aluminum layer by a molten interlayer material, for example.

The light absorptive thin film stacks described herein can be deposited or coated on a region located at, for example, the perimeter of a substrate to be bonded to another material.

Thus, in one embodiment the light absorptive thin film stack is deposited on a first substrate, a second substrate is placed on top of the first substrate, and laser light is applied to the thin film stack disposed between the substrates to seal them together. In another embodiment, a first light absorptive thin film stack is deposited on a first substrate to bond the first substrate to an interlayer, which can in turn be bonded to a second substrate. A second light absorptive thin film stack can be deposited on the second substrate, for example, to laser seal the interlayer to the second substrate, thus joining the first and second substrates.

In addition, a substrate can be coated with an LCP interlayer before bonding to another material. A light absorptive thin film stack can be disposed on the LCP interlayer, or on an opposing substrate. LCPs are increasingly used in packaging applications. LCPs have advantageous barrier properties due to intra- and intermolecular forces acting on the polymer chains. Sheets of stretched LCP films can have very good moisture barrier properties, for example, because of the increased liquid crystalline ordering that is induced when the film is stretched. Use of stretched LCP sheets as interlayers in laser-based sealing is typically disadvantageous, however. The globally ordered, high barrier molecular state of stretched LCP sheets can change in the seal region, such that the molecular order becomes random upon heating and melting. This process is similar to the clearing point of liquid crystals as they undergo a phase transition to the isotropic fluid state. After cooling, the LCP in the seal region adopts a polycrystalline structure that typically possesses reduced barrier properties compared to the globally-oriented sheet-form in before heating.

In one embodiment, a thin film stack is bonded to an LCP interlayer disposed on, or prebonded to, a substrate. In another embodiment, a substrate to which a thin film stack is to be bonded comprises LCP. In yet another embodiment, an LCP interlayer is disposed on a thin film stack that has been coated on a substrate.

Advantageously, the light absorptive thin film stacks described herein can be used with LCP sheets without the drawbacks commonly associated with stretched LCP sheets in laser sealing applications. Without being bound to any particular theory, it is believed that use of thin film stacks as described herein causes only that part of the LCP interlayer near the bonding interface to melt, while the bulk remainder of the LCP interlayer maintains the high barrier molecular state associated with stretched LCP sheets. In one embodiment, targeted melting of a portion of the LCP interlayer is achieved by controlling the laser light exposure dose. In another embodiment, targeted melting of a portion of the LCP interlayer is achieved by selecting a light absorptive thin film stack whose optical absorbance characteristics cause melting at the interface between the LCP interlayer and the surface to be bonded to the interlayer. Selection of a light absorptive thin film stack for a particular wavelength of light, such that the thin film stack absorbs a high percentage of the incident light and heating is confined to a small volume at the interface of two materials, is described in greater detail above.

Light absorptive thin film stacks according to embodiments described herein offer many advantages. The ability to precisely deliver light and confine heat generation using the thin film stack is particularly advantageous because localization occurs not only at the perimeter bond line located in the x,y plane of the device package, but also within a precise volume or thickness of the device package measured along the z-axis. Thus, in some embodiments, the dimensions of the seal in the x,y plane are significantly reduced compared to conventional laser-based seals. In one embodiment, the seal formed by methods described herein is approximately 0.1 to approximately 0.5 millimeters wide in the x, y plane. Further, the ability to localize heat along the z-axis can allow a much higher temperature to be generated at the interface to be bonded for a much shorter time, thereby preventing heat from being conducted to nearby active devices.

In addition, localized heating at the interface to be bonded can ensure maximum utilization of the incident light energy applied to the device package. For example, a light absorptive thin film stack can be selected such that melting occurs only or substantially at the interface between two materials. Efficiently using incident light energy in this manner can also allow for superior device yield and reliability, because heat effects on active devices close to the seal region are minimized or eliminated. As described above, with light absorption and heat generation confined to a very precise and relatively small volume, there is insufficient time for the heat to reach nearby active devices before the heat is absorbed and/or dissipated. Another benefit of localized light absorption and heat generation is that built-in stresses at the seal region due to thermal expansion mismatch can be minimized or eliminated. Further, there are significant cost advantages associated with more efficient conversion of light energy to heat in laser-based sealing applications, as the required power level of the laser source can be reduced while increasing throughput.

The laser-sealing methods described herein can also accommodate driver lines and traces disposed on a substrate. The light absorptive thin film stack can be treated with a laser without melting the traces, such that the traces pass unaffected through the laser-treated thin film seal. As described above, the ability to localize heat and confine heat generation precisely can translate to decreased laser power requirements and shortened laser application times. The interface between two materials can be heated quickly and efficiently, such that the melt point of the substrate is reached before the traces are affected. Traces can also be highly reflective, further minimizing heating effects from a relatively short pulse of laser light.

Use of thin film stacks as described herein can also reduce the need to focus incident light. With all or a substantial portion of the incident light absorbed in a small volume of material, a large amount of heat is generated precisely where it is needed—at the interface between two materials to be bonded—even when the incident light is not focused. Further, the thin film stacks described herein can absorb incident light from a variety of angles and through a variety of materials, such as diffuse substrates and substrates that typically scatter light. In contrast, focusing light through such diffuse or scattering substrates to create a bond using conventional interlayers can be difficult.

Embodiments of the light absorptive thin film stacks can also improve seal performance where interlayers such as LCP are used. As detailed above, normal sealing techniques can cause stretched LCP sheets to lose advantageous barrier properties upon melting. Thin film stacks as described herein can minimize this effect and cause only the interface region of an interlayer to melt.

Light absorptive thin film stacks can also be used to hermetically seal and package silicon MEMS devices. Conventionally, hermetic MEMS packaging is a high temperature and high pressure process. The required high bonding temperatures limit the types of devices that can be packaged. Embodiments of light absorptive thin film stacks can overcome this limitation. In one embodiment, a very thin light absorptive film is deposited on a silicon substrate to be bonded to a second material, which is placed on top of the silicon substrate. Pressure is applied to the device, and a relatively small amount of light is applied to the thin film stack to create a hermetic seal. A minimal amount of heat may also be applied to the device, but the overall increase in temperature is less than that required in conventional methods. Using thin film stacks as described herein, the device can be exposed to a maximum temperature that is less than that possible with interlayers commonly used in laser-based sealing.

Using thin film stacks over conventional interlayers to package silicon MEMS devices offers another advantage. Conventional interlayers do not absorb light, such as infrared laser light, as well as embodiments of the thin film stack. As a result, thicker interlayers must be used to ensure sufficient laser light is absorbed to create a seal. Increasing the thickness of the interlayer in this way introduces problems associated with mismatched thermal expansion between materials. The very thin light absorptive films described herein eliminate or minimize issues associated with mismatched coefficients of thermal expansion.

In some embodiments, the thin film stacks described herein comprise at least three layers, including an absorber layer, a spacer layer, and a reflective layer. In some embodiments, the thin film stack comprises fewer than three layers. In one embodiment, for example, the thin film stack comprises an absorber layer and a reflective layer. In another embodiment, the thin film stack comprises a metal absorber layer disposed between two glass substrates. Upon application of laser light, the absorber layer heats the glass substrates above the glass transition temperature. This causes the glass to expand and begin to flow, sealing the two substrates. In yet another embodiment, a metal absorber layer with a melting temperature higher than the melting temperature of the glass substrates is selected. In still another embodiment, the substrates comprise a low-melting temperature glass, such as but not limited to soda lime (approximate melting temperature of 500° Celsius). In addition, the thin film stack can comprise a plated solder chosen so that fluxless flow and adhesion is achieved between two glass substrates.

Persons of skill in the art will understand that the methods and devices described herein differ from conventional methods. In one such conventional method, a laser is applied to metal strips, such as solder, disposed between two substrates, melting the metal and creating a "weld bond" between the substrates. In another conventional method, glass, ceramic, or metal members are fused by scanning a laser beam along adjacent edges of the members, without the use of solders, interlayers, or adhesives. In contrast, embodiments of the thin film stacks described herein can comprise metals with high melting temperatures. The metal can be heated with a laser beam that propagates through a substrate without being absorbed by the substrate. The highly absorptive properties of the thin film stack cause the metal to heat up, such that a second material adjacent to the heated metal melts, creating a bond between the substrate and the second material. In some embodiments, the substrate also melts, in addition to the second material. Embodiments of the thin film stacks described herein can also include spacer layers that melt and form a bond between the substrate and the second material.

The skilled artisan will understand that the laser-based sealing methods and devices described herein are not limited to MEMS devices. The light absorptive thin film stacks described herein can be used in any display device requiring sealing or packaging, such as OLED or LCD devices. Further, the skilled artisan will understand that the laser treatment described herein is not limited to glass surfaces, but can be employed on such materials as, but not limited to, ceramics, polymers, metals, and semiconductor materials such as silicon.

Those of skill in the art will also understand that the various illustrative logical blocks, modules, circuits, and algorithm steps described in connection with the embodiments disclosed herein may be implemented as electronic hardware, computer software, or combinations of both. The various illustrative components, blocks, modules, circuits, and steps have been described generally in terms of their functionality. Whether the functionality is implemented as hardware or software depends upon the particular application and design constraints imposed on the overall system. Skilled artisans recognize the interchangeability of hardware and software under these circumstances, and how best to implement the described functionality for each particular application. As examples, the various illustrative logical blocks, modules, circuits, and algorithm steps described in connection with the embodiments disclosed herein may be implemented or performed with a digital signal processor (DSP), an application specific integrated circuit (ASIC), a field programmable gate array (FPGA) or other programmable logic device, discrete gate or transistor logic, discrete hardware components such as, e.g., registers and FIFO, a processor executing a set of firmware instructions, any conventional programmable software module and a processor, or any combination thereof.

The processor may be a microprocessor, but in the alternative, the processor may be any conventional processor, controller, microcontroller, or state machine. The software module could reside in RAM memory, flash memory, ROM memory, registers, hard disk, a removable disk, a CD-ROM, or any other form of storage medium known in the art. Those of skill would further appreciate that the data, instructions, commands, information, signals, bits, symbols, and chips that may be referenced throughout the above description are represented by voltages, currents, electromagnetic waves, magnetic fields or particles, optical fields or particles, or any combination thereof.

The previous description of the preferred embodiments is provided to enable any person skilled in the art to make or use the disclosed embodiments. The various modifications to these embodiments will be readily apparent to those skilled in the art, and the generic principles defined herein may be applied to other embodiments without the use of the inventive faculty. Thus, the disclosed embodiments are not intended to be limited to the embodiments shown herein but is to be accorded the widest scope consistent with the principles and novel features disclosed herein.

What is claimed is:

1. An electronic device package, comprising:
   a substrate comprising an electronic device;
   a backplate; and
   a light-treated thin film seal disposed between the substrate and the backplate to form a package comprising the electronic device, wherein the thin film seal includes a spacer layer, a reflective layer, and an absorber layer on the opposite side of the spacer layer as the reflective layer.

2. The device package of claim 1, wherein the light-treated thin film seal comprises a laser-light-treated thin film seal.

3. The device package of claim 1, wherein the substrate comprises glass, plastic, metal, or silicon.

4. The device package of claim 1, wherein the backplate comprises glass, plastic, metal, or silicon.

5. The device package of claim 1, wherein the spacer layer comprises a silicon dioxide, a metal oxide, a nitride, or a polymer.

6. The device package of claim 1, wherein the absorber layer comprises molybdenum, chromium, silver, or a molybdenum-chromium alloy.

7. The device package of claim 1, wherein the reflective layer comprises a metal.

8. The device package of claim 1, wherein the electronic device comprises a MEMS device.

9. The device package of claim 1, wherein the electronic device comprises an organic light emitting diode (OLED) device.

10. The device package of claim 1, wherein the electronic device comprises an interferometric modulator device.

11. The device package of claim 1, further comprising:
a processor that is configured to communicate with said electronic device, said processor being configured to process image data; and
a memory device that is configured to communicate with said processor.

12. The device package of claim 11, further comprising a driver circuit configured to send at least one signal to said electronic device.

13. The device package of claim 12, further comprising a controller configured to send at least a portion of said image data to said driver circuit.

14. The device package of claim 11, further comprising an image source module configured to send said image data to said processor.

15. The device package of claim 14, wherein said image source module comprises at least one of a receiver, transceiver, and transmitter.

16. The device package of claim 11, further comprising an input device configured to receive input data and to communicate said input data to said processor.

17. An electronic device package, comprising:
means for supporting an electronic device;
means for covering the electronic device to form a package; and
a light-treated thin film seal between the covering means and the supporting means, the thin film seal including a plurality of layers that have been exposed to light to seal the supporting means to the covering means, the plurality of layers including at least a reflective layer, a spacer layer, and an absorber layer, wherein the spacer layer is over the reflective layer and the absorber layer is over the spacer layer.

18. The electronic device package of claim 17, wherein at least one of the plurality of layers was melted after exposing the plurality of layers to the light.

19. The electronic device package of claim 17, wherein the light-treated thin film seal comprises a laser-light-treated thin film seal.

20. The electronic device package of claim 17, wherein the supporting means comprises a transparent substrate.

21. The electronic device package of claim 17, wherein the covering means comprises a backplate.

22. The electronic device package of claim 17, wherein a portion of at least one of the supporting means and the covering means proximate to the plurality of layers was melted after exposing the plurality of layers to the light.

23. The electronic device package of claim 17, further comprising:
a processor that is configured to communicate with the electronic device, said processor being configured to process image data; and
a memory device that is configured to communicate with the processor.

* * * * *